United States Patent
Lee et al.

(10) Patent No.: US 12,087,669 B1
(45) Date of Patent: Sep. 10, 2024

(54) INTEGRATED CIRCUIT DEVICES INCLUDING DISCHARGING PATH AND METHODS OF FORMING THE SAME

(71) Applicant: Samsung Electronics Co., Ltd., Suwon-si (KR)

(72) Inventors: Jaehong Lee, Latham, NY (US); Sooyoung Park, Clifton Park, NY (US); Wonhyuk Hong, Clifton Park, NY (US); Kang-Ill Seo, Springfield, VA (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/543,111

(22) Filed: Dec. 18, 2023

Related U.S. Application Data

(60) Provisional application No. 63/519,293, filed on Aug. 14, 2023.

(51) Int. Cl.
| | |
|---|---|
| *H01L 21/00* | (2006.01) |
| *H01L 21/8238* | (2006.01) |
| *H01L 23/48* | (2006.01) |
| *H01L 27/07* | (2006.01) |
| *H01L 27/092* | (2006.01) |
| *H01L 29/06* | (2006.01) |

(Continued)

(52) U.S. Cl.
CPC .... *H01L 23/481* (2013.01); *H01L 21/823807* (2013.01); *H01L 21/823814* (2013.01); *H01L 21/823842* (2013.01); *H01L 21/823871* (2013.01); *H01L 27/0727* (2013.01); *H01L 27/092* (2013.01); *H01L 29/0673* (2013.01); *H01L 29/41733* (2013.01); *H01L 29/42392* (2013.01); *H01L 29/66439* (2013.01); *H01L 29/775* (2013.01); *H01L 29/78696* (2013.01)

(58) Field of Classification Search
CPC ........... H01L 23/481; H01L 21/823807; H01L 21/823814
See application file for complete search history.

(56) References Cited

U.S. PATENT DOCUMENTS

| | | | | |
|---|---|---|---|---|
| 5,439,848 A | * | 8/1995 | Hsu ........................ | H01L 23/485 257/E23.152 |
| 5,977,579 A | * | 11/1999 | Noble ................. | H10B 12/0383 257/302 |

(Continued)

FOREIGN PATENT DOCUMENTS

| | | | | |
|---|---|---|---|---|
| CA | 1270060 A | * | 6/1990 | ............. G11C 15/04 |
| CN | 111128996 A | * | 5/2020 | ......... H01L 27/0255 |

(Continued)

*Primary Examiner* — Laura M Menz
(74) *Attorney, Agent, or Firm* — Myers Bigel, P.A.

(57) ABSTRACT

Integrated circuit devices and methods of forming the same. As an example, an integrated circuit device may include a substrate; a first transistor structure on the substrate; a second transistor structure stacked in a vertical direction on the first transistor structure; an isolation layer between the first transistor structure and the second transistor structure in the vertical direction; and a diode structure on the substrate and adjacent to the first transistor structure in a horizontal direction. The diode structure may be part of a discharging path between a gate electrode of the second transistor structure and the substrate. The discharging path may extend through the isolation layer.

16 Claims, 19 Drawing Sheets

(51) Int. Cl.
*H01L 29/417* (2006.01)
*H01L 29/423* (2006.01)
*H01L 29/66* (2006.01)
*H01L 29/775* (2006.01)
*H01L 29/786* (2006.01)

(56) References Cited

U.S. PATENT DOCUMENTS

| | | | |
|---|---|---|---|
| 6,509,774 B2 * | 1/2003 | Park | H03K 5/133 |
| | | | 327/262 |
| 7,863,112 B2 | 1/2011 | Nair et al. | |
| 8,435,851 B2 * | 5/2013 | Erickson | H01L 27/088 |
| | | | 438/156 |
| 8,832,624 B1 | 9/2014 | Shroff et al. | |
| 9,337,179 B2 * | 5/2016 | Yoo | H01L 29/0804 |
| 9,490,249 B2 * | 11/2016 | Lue | H01L 21/823871 |
| 10,199,261 B1 | 2/2019 | Mcmahon et al. | |
| 10,283,411 B1 * | 5/2019 | Hook | H01L 27/0688 |
| 10,943,899 B2 * | 3/2021 | Kim | H01L 27/0629 |
| 11,164,791 B2 * | 11/2021 | Wu | H01L 27/088 |
| 11,600,520 B2 * | 3/2023 | Wang | H01L 21/02565 |
| 11,764,207 B2 * | 9/2023 | Hong | H01L 21/823807 |
| | | | 257/350 |
| 2003/0139024 A1 * | 7/2003 | Ker | H01L 27/0814 |
| | | | 438/149 |
| 2014/0264520 A1 * | 9/2014 | Reisiger | H01L 27/0288 |
| | | | 438/585 |
| 2016/0071832 A1 * | 3/2016 | Yoo | H01L 27/067 |
| | | | 257/577 |
| 2020/0135716 A1 * | 4/2020 | Kim | H01L 27/088 |
| 2021/0407845 A1 * | 12/2021 | Wang | H01L 29/24 |
| 2022/0328562 A1 * | 10/2022 | Wu | H01L 29/78642 |
| 2023/0092061 A1 * | 3/2023 | Hong | H01L 27/0629 |
| | | | 257/350 |
| 2023/0215761 A1 * | 7/2023 | Wang | H01L 21/02565 |
| | | | 257/43 |
| 2023/0262960 A1 * | 8/2023 | Seo | H10B 12/315 |
| | | | 257/295 |
| 2023/0275021 A1 * | 8/2023 | Hong | H01L 23/5226 |
| 2023/0361112 A1 * | 11/2023 | Hong | H01L 27/067 |
| 2023/0378164 A1 * | 11/2023 | Hong | H01L 29/0657 |
| 2023/0389275 A1 * | 11/2023 | Simsek-Ege | H10B 12/03 |
| 2024/0064953 A1 * | 2/2024 | Chang | H10B 10/12 |

FOREIGN PATENT DOCUMENTS

| | | | | |
|---|---|---|---|---|
| CN | 115483217 A | * | 12/2022 | G11C 16/08 |
| CN | 116013963 B | * | 5/2023 | |
| DE | 102018205057 B4 | * | 12/2022 | B82Y 10/00 |
| JP | 2001345421 A | * | 12/2001 | H01L 27/0255 |
| JP | 2010129895 A | * | 6/2010 | H01L 27/0203 |
| JP | 4746734 B2 | * | 8/2011 | |
| WO | WO-2021094856 A1 | * | 5/2021 | H01L 21/76895 |

\* cited by examiner

INTEGRATED CIRCUIT DEVICES INCLUDING DISCHARGING PATH AND METHODS OF FORMING THE SAME

CROSS-REFERENCE TO RELATED APPLICATION

This application claims priority to U.S. Provisional Application Ser. No. 63/519,293 entitled "INTEGRATED CIRCUIT DEVICES INCLUDING DISCHARGING PATH AND METHODS OF FORMING THE SAME," filed in the United States Patent and Trademark Office on Aug. 14, 2023, and the entire contents of the above-identified application are incorporated by reference herein in its entirety.

BACKGROUND

The present disclosure generally relates to the field of integrated circuit devices and, more particularly, to three-dimensional integrated circuit devices that include stacked transistors.

Various structures of an integrated circuit device including stacked transistors and methods of forming the same have been proposed for secure isolation between elements of stacked transistors (e.g., stacked source/drain regions or stacked gate electrodes).

SUMMARY

According to some embodiments of the present inventive concepts, an integrated circuit device may include a substrate; a first transistor structure on the substrate; a second transistor structure stacked in a vertical direction on the first transistor structure; an isolation layer between the first transistor structure and the second transistor structure in the vertical direction; and a diode structure on the substrate and adjacent to the first transistor structure in a horizontal direction. The diode structure may be part of a discharging path between a gate electrode of the second transistor structure and the substrate. The discharging path may extend through the isolation layer.

According to some embodiments of the present inventive concepts, an integrated circuit device may include a substrate, and a stacked structure. The stacked structure may include a first transistor structure on the substrate and comprising a first source/drain region having a first conductivity type; and a second transistor structure stacked in a vertical direction on the first transistor structure, the second transistor structure comprising a second source/drain region having a second conductivity type that is opposite from the first conductivity type. The integrated circuit device may include an isolation layer between the first transistor structure and the second transistor structure in the vertical direction; and the integrated circuit device may include a discharging path between a gate electrode of the second transistor structure and the substrate. The discharging path may extend through the isolation layer. The discharging path may include a diode structure, and at least a portion of the diode structure may be below an upper surface of the substrate.

According to some embodiments of the present inventive concepts a method of forming an integrated circuit device may include: forming a stacked structure on a substrate, the stacked structure comprising lower channel layers, upper channel layers, and an isolation layer between the lower and upper channel layers; forming source/drain regions in the stacked structure, the source/drain regions comprising lower source/drain regions and upper source/drain regions; forming a diode structure in the stacked structure; forming gate structures in the stacked structure, the gate structures comprising lower gate structures and upper gate structures; and forming a discharging path between an upper gate structure and the substrate, the discharging path including the diode structure and extending through the isolation layer.

The present disclosure is not limited to the above-described embodiments and inventive concepts, and other embodiments and inventive concepts are provided in the figures and the detailed description thereof.

BRIEF DESCRIPTION OF THE DRAWINGS

Like reference numerals may refer to corresponding parts throughout the drawings.

DETAILED DESCRIPTION

Figure 1:
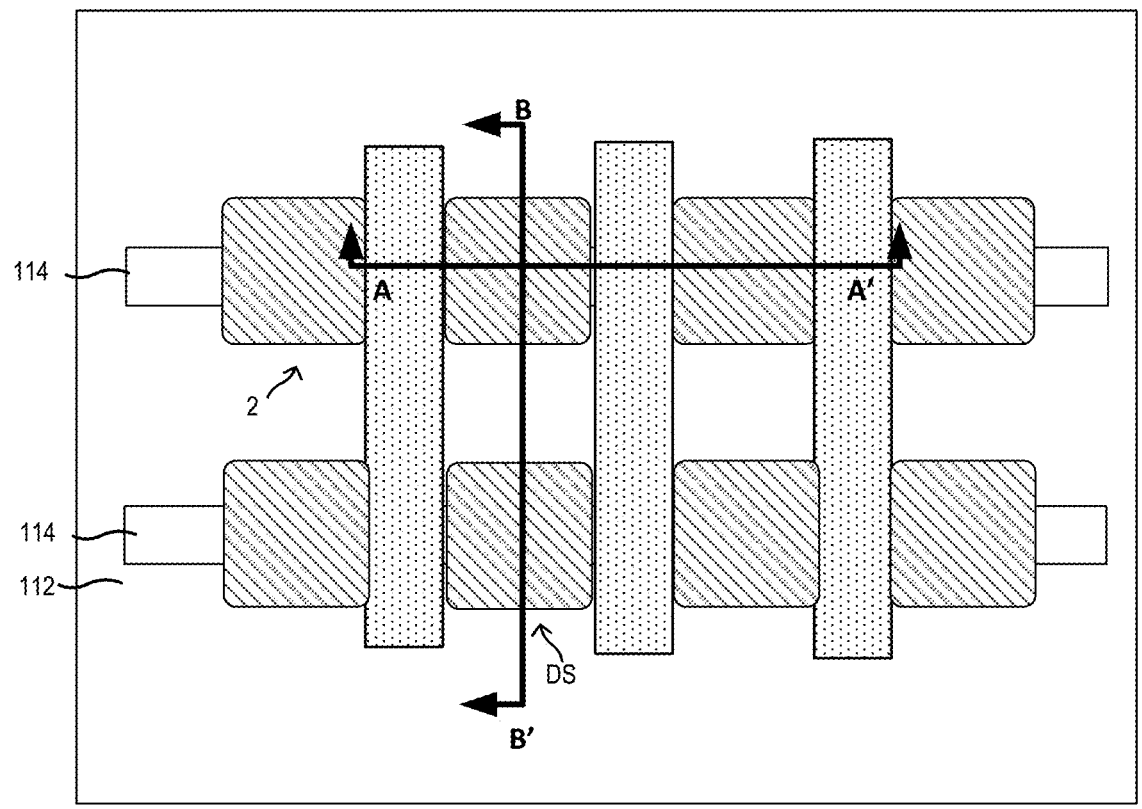
FIG. 1 is a layout of an integrated circuit device according to some embodiments.
Figure 1:
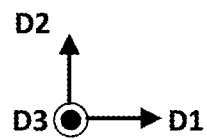
Figure 2A:
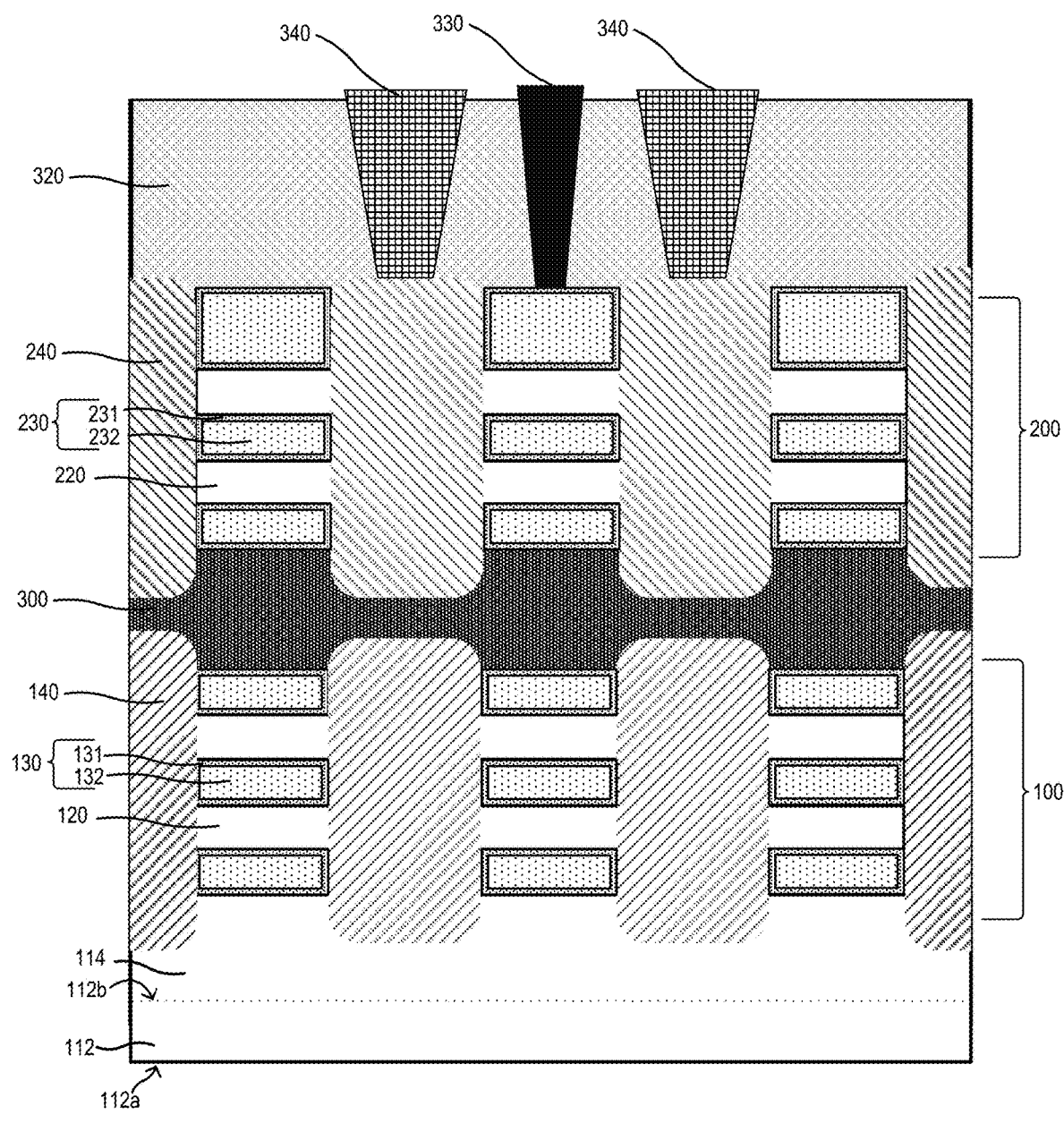
FIGS. 2A and 2B are cross-sectional views of an integrated circuit device taken along the line A-A' and the line B-B', respectively, in FIG. 1 according to some embodiments.
Figure 2B:
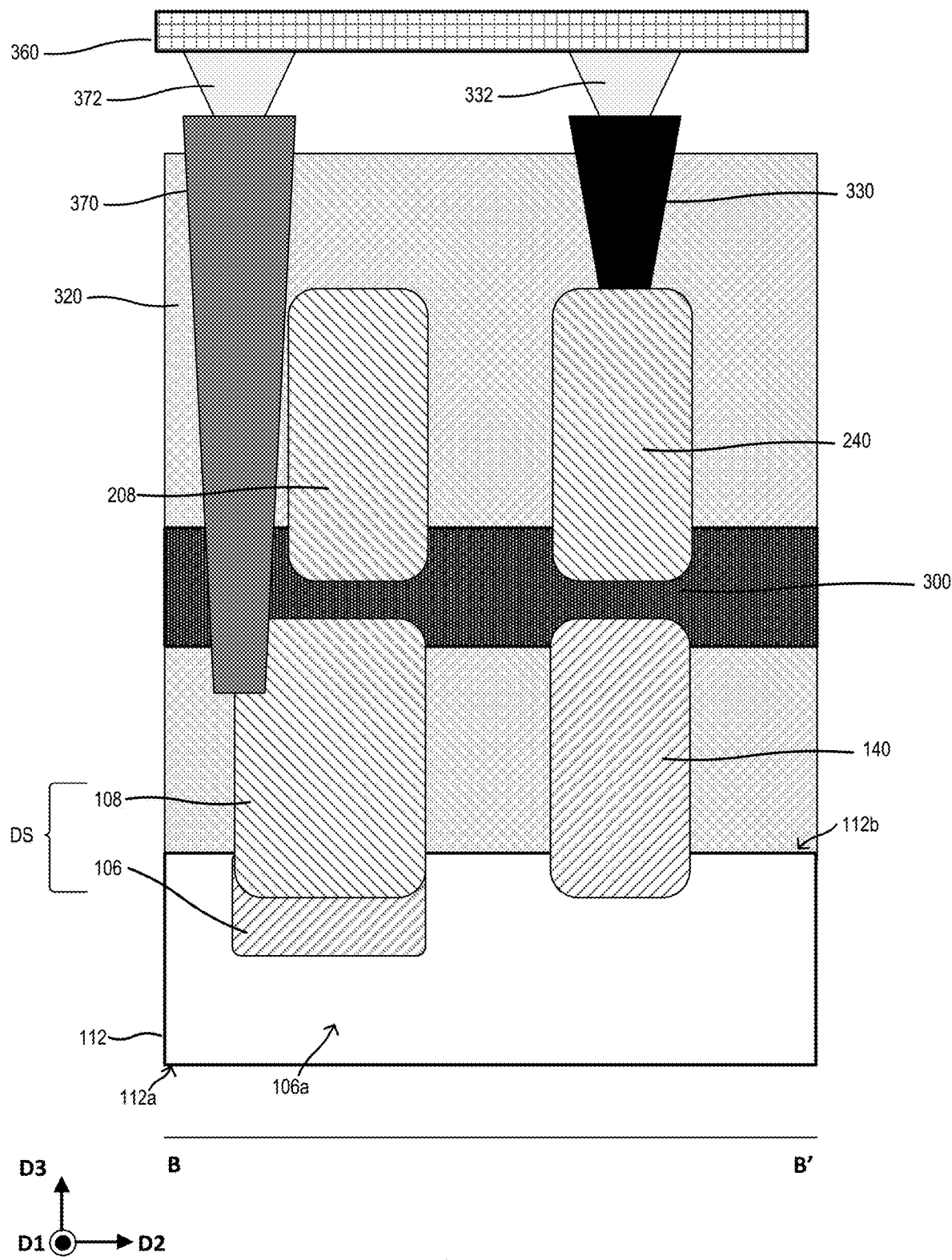

FIG. 1 is a layout of an integrated circuit device according to some embodiments. FIGS. 2A and 2B are cross-sectional views of an integrated circuit device 1 taken along the line A-A' and the line B-B', respectively, in FIG. 1 according to some embodiments. For simplicity in the drawings and in the description thereof, not all components are shown in each of the figures, and some components may be omitted from the drawings entirely.

Referring to FIGS. 1, 2A and 2B, the first integrated circuit device 1 may include a stacked structure 2 provided on a substrate 112. In some embodiments, a plurality of stacked structures 2 may be provided. Each stacked structure 2 may include an upper transistor structure 200 and a lower transistor structure 100 that is provided between the substrate 112 and the upper transistor structure 200. The upper transistor structure 200 may be stacked on the lower transistor structure 100, which may be on the substrate 112.

The substrate 112 may include a lower surface 112a and an upper surface 112b opposite the upper surface 112a. The lower surface 112a and the upper surface 112b may be parallel to each other. As used herein, a "lower" component on the substrate 112 may refer to a first component that is closer to a lower surface 112a of the substrate 112 than a second component on the substrate 112. Similarly, an "upper" component may refer to a second component which may on the substrate 112 and farther from the lower surface 112a of the substrate 112 than the first component.

A semiconductor region 114 (e.g., a first semiconductor region 114a, a second semiconductor region 114b) may be provided on the substrate 112. The semiconductor region 114 may extend in a first direction D1 (also referred to as a first horizontal direction) and may be spaced apart from other semiconductor regions 114 in a second direction D2 (also referred to as a second horizontal direction). As used herein, an element (e.g., an "element A") said to extend in a direction (e.g., "direction X"), or similar language, may mean that the element extends longitudinally in the direction. The first direction D1 may be perpendicular to the second direction D2.

The semiconductor region 114 may protrude from the upper surface 112b of the substrate 112 in a third direction D3 (also referred to as a vertical direction). The third direction D3 may be perpendicular to the first direction D1 and the second direction D2. In some embodiments, the third direction D3 may be perpendicular to the lower surface 112a and the upper surface 112b of the substrate 112.

The substrate 112 may include one or more semiconductor materials, for example, Si, Ge, SiGe, GaP, GaAs, SiC, SiGeC and/or InP or may include insulating material, for example, silicon oxide, silicon oxynitride, silicon nitride, silicon carbonitride, silicon boron nitride and/or a low-k material. In some embodiments, the substrate 112 may be a bulk substrate (e.g., a bulk silicon substrate) or a semiconductor on insulator (SOI) substrate. For example, the substrate 112 may be a silicon wafer or may be an insulating layer.

The semiconductor region 114 may be, for example, a portion of the substrate 112 or may be a layer formed using the substrate 112 as a seed layer through, for example, an epitaxial growth process. For example, the semiconductor region 114 may include semiconductor material(s), for example, Si, Ge, SiGe, GaP, GaAs, SiC, SiGeC and/or InP.

A trench isolation layer (not shown) may be provided on the substrate 112. Semiconductor regions 114 adjacent to each other may be separated from each other by a portion of the trench isolation layer. The trench isolation layer may include an insulating material(s) (e.g., silicon oxide, silicon oxynitride, silicon nitride, silicon carbonitride and/or a low-k material). The low-k material may include, for example, fluorine-doped silicon oxide, organosilicate glass, carbon-doped oxide, porous silicon dioxide, porous organosilicate glass, spin-on organic polymeric dielectrics and/or spin-on silicon based polymeric dielectric. In some embodiments, a bottom insulating layer (not shown) may be formed between the substrate 112 at least portions of the lower transistor structure 100.

The lower transistor structure 100 may include lower channel regions 120 that may be stacked on the substrate 112 in the third direction D3 and may overlap each other in the third direction D3. As used herein, a first element and a second element may be said to overlap each other in a given direction if, as an example, at least one (straight) line can be drawn in the given direction that intersects both the first element and the second element. The lower channel regions 120 may be stacked on the semiconductor region (e.g., the semiconductor region 114). The lower channel regions 120 may include opposing side surfaces that are spaced apart from each other in the first direction D1, and the lower transistor structure 100 may include a pair of lower source/drain regions 140 respectively on those opposing side surfaces of the lower channel regions 120. The pair of lower source/drain regions 140 may contact those opposing side surfaces of the lower channel regions 120, respectively.

The lower transistor structure 100 may also include a lower gate structure 130 that may include a lower gate insulator 131 and a lower gate electrode 132. The lower gate electrode 132 may extend in the second direction D2 and may traverse one or more semiconductor regions 114. A portion of the lower channel regions 120 may surrounded by the lower gate electrode 132, and the lower gate insulator 131 may separate the lower channel regions 120 from the lower gate electrode 132. The lower channel regions 120 may extend through the lower gate electrode 124b in the first direction D1 and may contact the lower gate insulator 123b.

The upper transistor structure 200 may include upper channel regions 220 that may be stacked on the substrate 112 in the third direction D3 and may overlap each other in the third direction D3. The upper channel regions 220 may also overlap the lower channel regions 120 in the third direction D3. The upper channel regions 220 may include opposing side surfaces that are spaced apart from each other in the first direction D1, and the upper transistor structure 200 may include a pair of upper source/drain regions 240 respectively on those opposing side surfaces of the upper channel regions 220. The pair of upper source/drain regions 240 may contact those opposing side surfaces of the upper channel regions 220, respectively.

The upper transistor structure 200 may also include an upper gate structure 230 that may include an upper gate insulator 231 and an upper gate electrode 232. The upper gate electrode 232 may extend in the second direction D2 and may traverse the semiconductor region 114. A portion of the upper channel regions 220 may be surrounded by the upper gate electrode 232, and the upper gate insulator 231 may separate the upper channel regions 220 from the upper gate electrode 232. The upper channel regions 220 may extend through the upper gate electrode 232 in the first direction D1 and may contact the upper gate insulator 231.

The lower channel regions 120 and upper channel regions 220 may include, for example, semiconductor material(s) (e.g., Si, Ge, SiGe, GaP, GaAs, SiC, SiGeC and/or InP). In some embodiments, the lower channel regions 120 may include a material different from the upper channel regions 220. In some embodiments, each of the lower channel regions 120 and the upper channel regions 220 may be a nanosheet that may have a thickness in a range of from 1 nm to 100 nm in the third direction D3 or may be a nanowire that may have a circular cross-section with a diameter in a range of from 1 nm to 100 nm.

The lower gate insulator 131 and the upper gate insulators 231 may include, for example, a silicon oxide layer and/or a high-k material layer. The high-k material layer may include, for example, $Al_2O_3$, $HfO_2$, $ZrO_2$, $HfZrO_4$, $TiO_2$, $Sc_2O_3Y_2O_3$, $La_2O_3$, $Lu_2O_3$, $Nb_2O_5$ and/or $Ta_2O_5$. The lower gate insulator 131 and upper gate insulator 231 may be a gate dielectric layer. The lower gate electrodes 132 and the upper gate electrodes 232 may include, for example, a metallic layer that includes, for example W, Al, Cu, Mo, Co and/or Ru and may additionally include work function layer(s) (e.g., a TiN layer, a TaN layer, a TiAl layer, a TiC layer, a TiAlC layer, a TiAlN layer and/or a WN layer).

In some embodiments, a lower insulating spacer, e.g., a lower gate spacer or a lower inner gate spacer (not shown)

may be provided between and separate the lower gate structure 130 and the lower source/drain region 140. In some embodiments, an upper insulating spacer, e.g., an upper gate spacer or an upper inner gate spacer (not shown), may be provided between and separate the upper gate structure 230 and an upper source/drain region 240. Each of the lower insulating spacer and the upper insulating spacer may include, for example, silicon oxide, silicon oxynitride, silicon nitride, silicon carbonitride and/or a low-k material.

In some embodiments, the lower transistor structure 100 and the upper transistor structure 200 may have different conductivity types, and the stacked structure 2 including the lower transistor structure 100 and the upper transistor structure 200 may be a complementary metal-oxide-semiconductor (CMOS). In some embodiments, the lower source/drain regions 140 of the lower transistor structure 100 may have a first conductivity type (e.g., P-type conductivity), and the upper source/drain regions 240 of the upper transistor structure 200 may have a second conductivity type (e.g., N-type conductivity) that is opposite to the first conductivity type.

Still referring to FIGS. 1 and 2, the first integrated circuit device 1 may further include a middle isolation layer 300 that is between the lower transistor structure 100 and the upper transistor structure 200 in the third direction D3. The middle isolation layer 300 may provide isolation between the lower transistor structure 100 and the upper transistor structure 200. Although the middle isolation layer 300 is shown as a single layer, the present disclosure is not limited thereto. For example, in some embodiments an intergate isolation layer may be provided between the lower gate structure 130 and the upper gate structure 230, and an inter-source/drain isolation layer may be provided between a lower source/drain region 140 of the lower transistor structure 100 and an upper source/drain region 240 of the upper transistor structure 200. The intergate isolation layer and the inter-source/drain isolation layer may be provided at substantially an equal distance from a upper surface 112b of the substrate 112.

In some embodiments, the first integrated circuit device 1 may further include additional insulating layers, such as an insulating layer 320. The additional insulating layers may be on one or more sides of the first integrated circuit device 1, or the lower transistor structure 100 or the upper transistor structure 200 thereof, e.g., in a first direction D1, second direction D2, and/or third direction D3.

Gate contacts 330 may be arranged to provide electrical connections to the gate electrodes 132/232. Source/drain contacts 340 may be arranged to provide electrical connections to the source/drain regions 140/240. Although the source/drain contacts 340 are shown as being connected to the upper transistor structure 200 in FIG. 2A, the present disclosure is not limited thereto, and source/drain contacts 340 may be connected with the lower source/drain regions 140 of the lower transistor structure 100. Similarly, although the gate contacts 330 are shown as being connected to the upper transistor structure 200 in FIG. 2A, the present disclosure is not limited thereto, and gate contacts 330 may be connected with the lower gate electrodes 132 of the lower transistor structure 100.

Although not shown in FIGS. 1 and 2A, it can be seen in FIG. 2B that one or more metal layers, including a first metal layer 360, may be provided above the source/drain contacts 340 and gate contacts 330. The one or more metal layers may be back end of line (BEOL) metal layers. Metal lines provided in the one or more metal layers may be electrically coupled to the source/drain contacts 340 and/or gate contacts 330.

During semiconductor fabrication processes, plasma using processes may be used at one or more steps. Plasma induced charges may be captured on the one or more metal lines, and the plasma induced charges may flow into gate dielectric layers (such as lower gate insulator 131 or upper gate insulator 231), resulting in potential breakdown of a gate dielectric layer. This accumulation of charge may be particularly problematic for the upper transistor structure 200, as the presence of the middle isolation layer 300 may act as a barrier for charges that accumulate in the upper gate structure 230 from discharging into e.g., the substrate 112.

Accordingly, pursuant to some embodiments of the present inventive concepts, a discharging path may be provided between the substrate 112 and the upper transistor structure 200. The discharging path may include a diode structure DS. With reference to FIGS. 1 and 2B, the diode structure DS may be located adjacent to the stacked structure 2 in a horizontal direction (e.g., the second direction D2).

The diode structure DS may include a first semiconductor region 106 and a second semiconductor region 108, which may be a first diode region 106 and a second diode region 108, respectively. The first diode region 106 may be a lower diode region may have a conductivity type that is the same as the conductivity type of the lower source/drain region 140 (e.g., the first conductivity type). The second diode region 108 may be an upper diode region and may have a conductivity type that is the same as the conductivity type of the upper source/drain regions 240 (e.g., the second conductivity type). The first diode region 106 and the second diode region 108 may directly contact one another and form a junction (e.g., a P-N junction) therebetween. In some embodiments, the first diode region 106 and the second diode region 108 may be vertically stacked, where the second diode region 108 is on the first diode region 106 in the third (vertical) direction D3.

The first diode region 106 and the second diode region 108 are shown to be wider in the second direction D2 than the lower source/drain regions 140 and the upper source/drain regions 240, but this is merely one example and the present disclosure is not limited thereto. In some embodiments, the first diode region 106 and/or the second diode region 108 may have the same dimensions in one or more directions as the lower source/drain region 140 and the upper source/drain regions 240. In some embodiments, the first diode region 106 and/or the second diode region 108 may have different dimensions in one or more directions than one or both of the lower source/drain regions 140 and the upper source/drain regions 240. At least one of the first diode region 106 and the second diode region 108 (or a portion thereof) may horizontally overlap with the lower source/drain region 140, e.g., in the second direction D2.

As seen in FIG. 2B, in some embodiments an upper surface of the lower source/drain region 140 of the lower transistor structure 100 and an upper surface of the second diode region 108 of the diode structure DS may be an equal distance from the substrate 112. As seen in FIG. 2B, in some embodiments at least a lower surface 106a of the first diode region 106 may be below an upper surface 112b of the substrate 112. In some embodiments, the entirety of the first diode region 106 may be below the upper surface 112b of the substrate 112. In some embodiments, the first diode region 106 may be a region or portion of the substrate 112 that is doped or receives dopants to provide a selected conductivity type therein. For example, where the first semiconductor region 106 is a P-type layer, a region or portion of the substrate 112 in which the diode structure DS is located may be provided with P-type dopants (e.g., boron (B), arsenic (Ar), phosphorous (P), and/or others).

In some embodiments, the second diode region 108 may be formed at a same time as the lower source/drain region 140.

In some embodiments, the middle isolation layer 300 may be above the diode structure DS.

In some embodiments, a third semiconductor region 208 may be formed above the second semiconductor region/second diode region 108 and the first semiconductor region/first diode region 106. The third semiconductor region 208 may be a dummy source/drain region, and may be formed at the same time as the upper source/drain regions 240.

A discharge contact 370 may be formed which may have at least a lower surface that contacts (e.g., directly contacts) the second diode region 108. The discharge contact may penetrate or extend through the middle isolation layer 300. The discharge contact 370 may be in electrical contact with the first metal layer 360 through a discharge via 372. The discharge via 372 may directly contact an upper surface or upper portion of the discharge contact 370. A gate via 332 may be formed which may electrically connect the first metal layer 360 with a gate contact 330. In some embodiments, one or more of the discharge via 372 and the gate via 332 are optional and a bottom or lower surface of the first metal layer 360 may directly contact upper surfaces of the discharge contact 370 and/or the gate contact 330.

Figure 3:
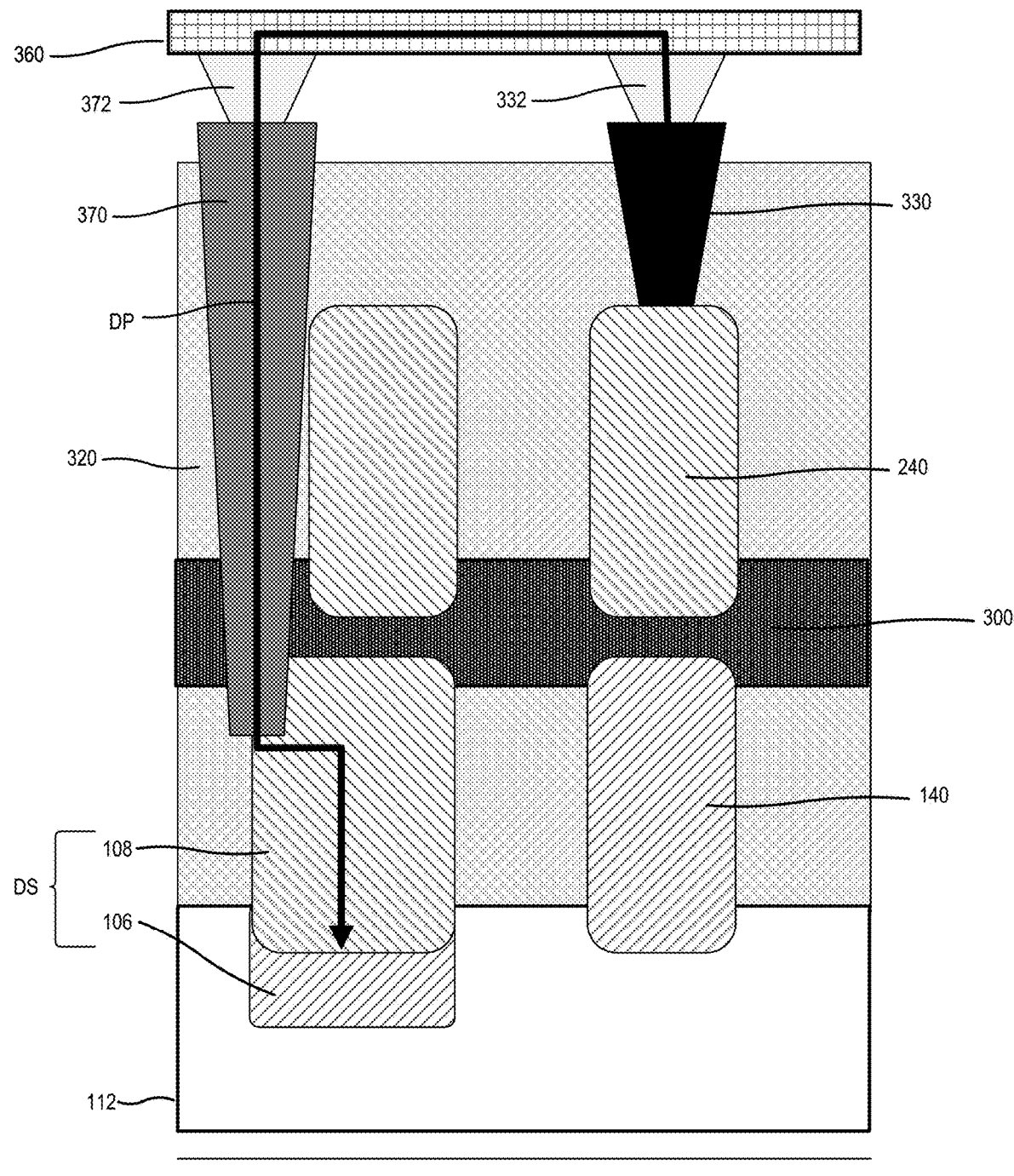
FIG. 3 is a schematic diagram showing a discharging path of an integrated circuit device according to some embodiments.
Figure 3:
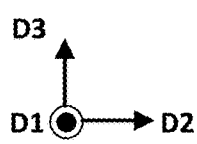
Figure 4:
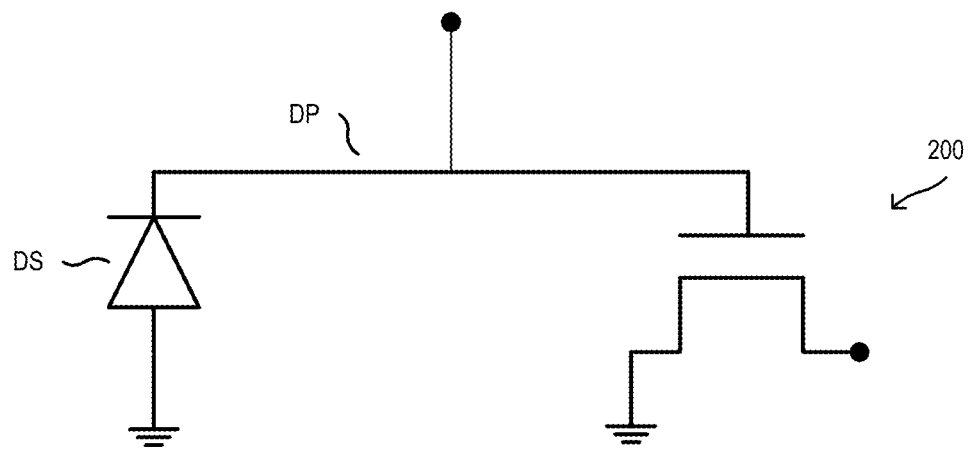
FIG. 4 is a circuit diagram showing a discharging path of an integrated circuit device according to some embodiments.

FIG. 3 is a schematic diagram showing that a discharging path DP between the upper transistor structure 200 of the stacked structure 2 and the substrate 112 may be formed, using at least one metal layer (e.g., the first metal layer 360), which may be a BEOL metal layer and using a diode structure DS that is formed adjacent to the stacked structure 2. FIG. 4 is a circuit diagram of some components of the integrated circuit device of FIG. 3 according to some embodiments.

The discharging path DP may be an electrical path from the upper gate structure 230 or the upper gate electrode 232 of the upper transistor structure 200 (which may be a testing transistor) to the substrate 112, and the discharging path DP may include the gate contact 330, the gate via 332, a metal line formed in the first metal layer 360, the discharge via 372, the discharge contact 370, and the diode structure DS (the second diode region 108 and the first diode region 106). The discharging path may extend through the middle isolation layer 300.

It is noted that although the metal layer 360 is described as the first metal layer 360, it is to be understood that any metal layer (e.g., M1, M2) on a common side of the substrate 112 with the stacked structure 2 may be used as in the discharging path DP.

The discharging path DP may provide a path for charges (e.g., plasma induced charges) that may be captured in the upper transistor structure 200 to dissipate or discharge, rather than accumulate in portions of the upper transistor structure 200, such as the upper channel regions 220, which may be floating regions. This may improve the performance and/or reliability of the integrated circuit device 1, for example because the upper gate insulator 231 may not be degraded or may not experience breakdown due to accumulated plasma induced charges.

Figure 5:
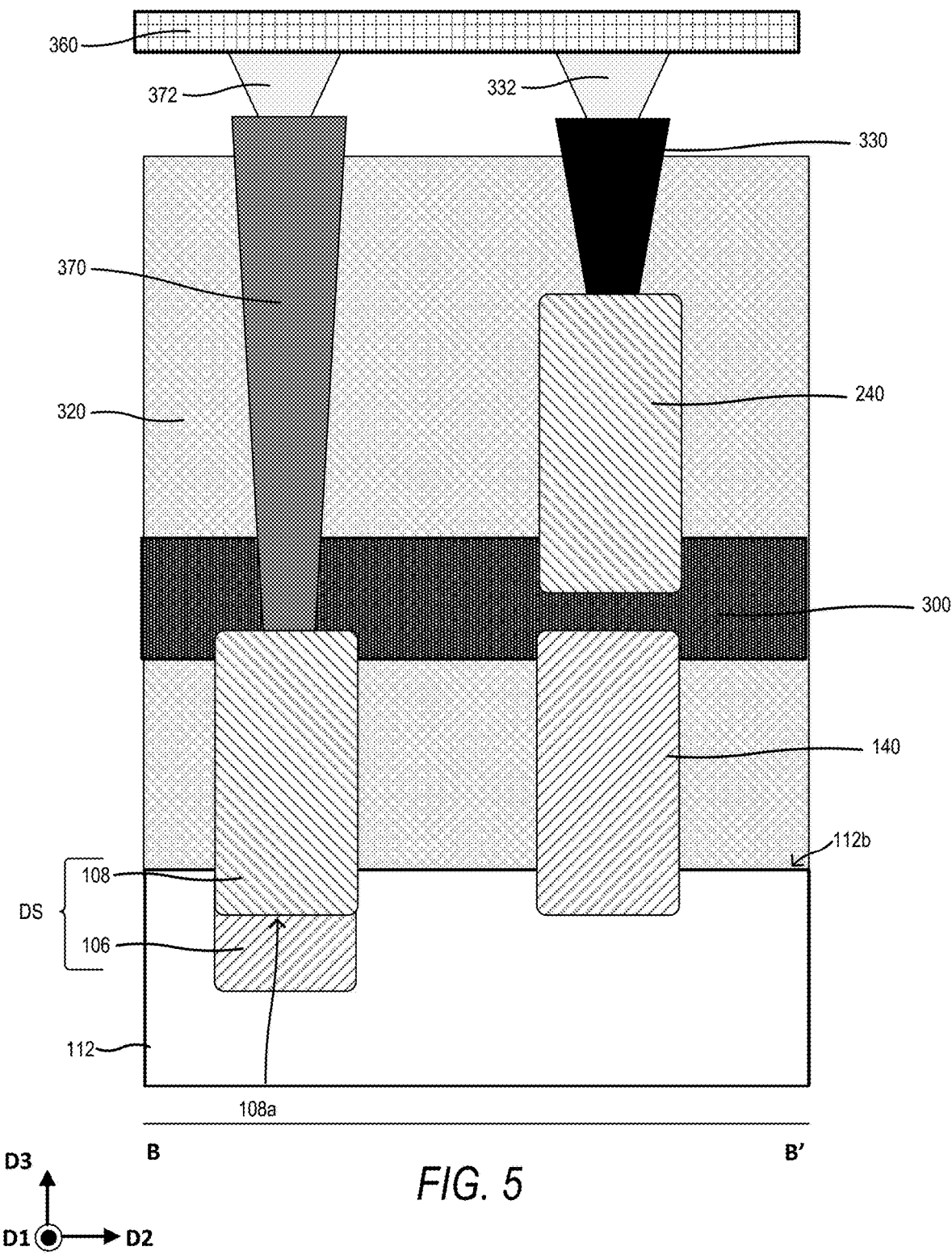
FIG. 5 is a cross-sectional view of an integrated circuit device taken along the line B-B' in FIG. 1 according to some embodiments.

FIG. 5 is a cross-sectional view of an integrated circuit device 2 taken along the line B-B' in FIG. 1 according to some embodiments. The integrated circuit device 2 may be similar to the integrated circuit 1 of FIGS. 1, 2A, and 2B with the primary difference being that the third semiconductor region 208 (the dummy source/drain region) may not be formed. FIG. 5 also shows that in some embodiments, the lower surface of the second diode region 108 may be below an upper surface 112b of the substrate 112. The integrated circuit device 1 of FIGS. 1, 2A, and 2B may be modified accordingly.

Figure 6:
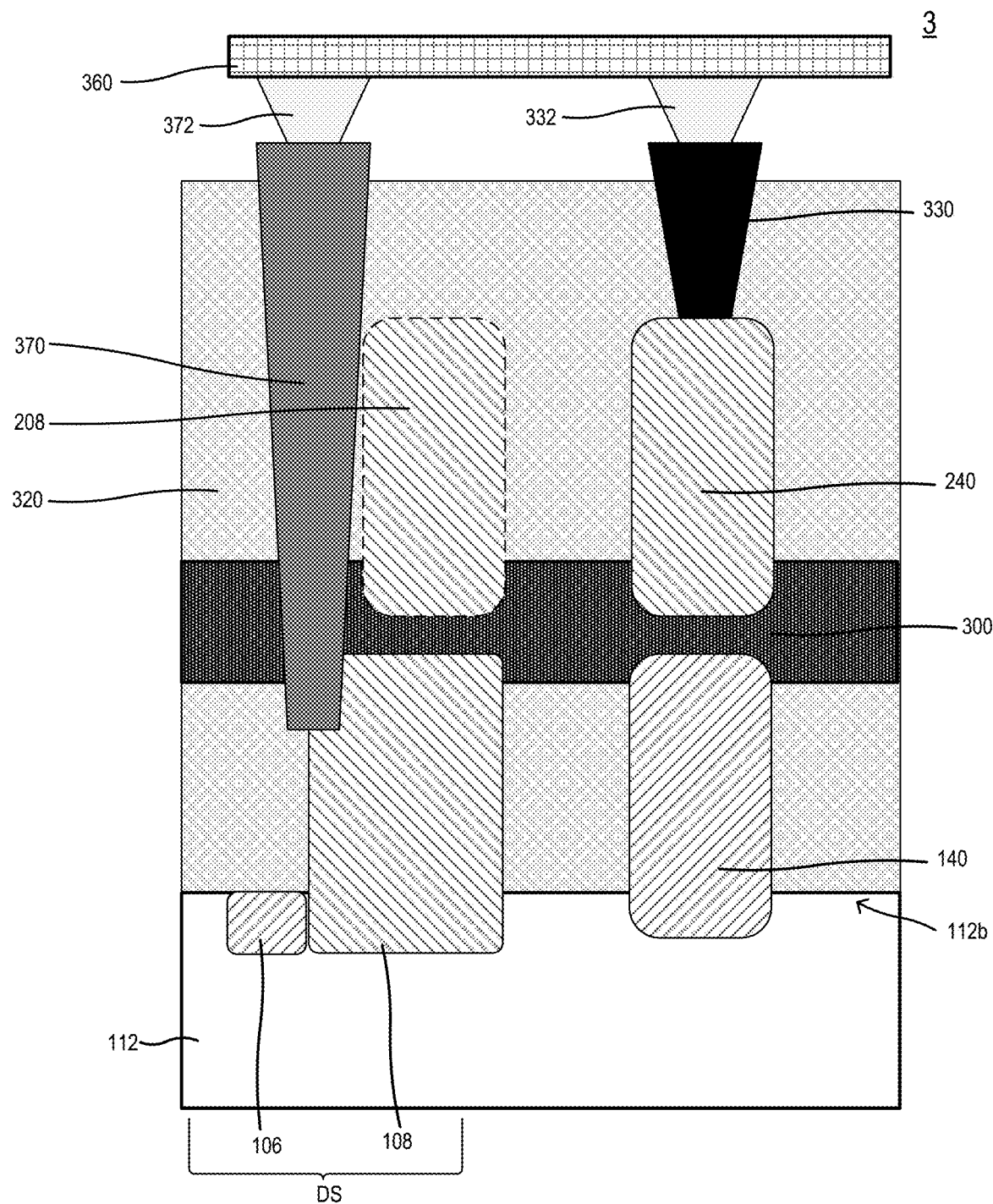
FIG. 6 is a cross-sectional view of an integrated circuit device taken along the line B-B' in FIG. 1 according to some embodiments.
Figure 6:
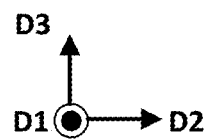

FIG. 6 is a cross-sectional view of an integrated circuit device 3 taken along the line B-B' in FIG. 1 according to some embodiments. The integrated circuit device 3 may be similar to the integrated circuit 1 of FIGS. 1, 2A, and 2B, with the primary difference being that the second diode region 108 and the first diode region 106 may not be vertically stacked, with the second diode region 108 adjacent to the first diode region 106 in a horizontal direction (e.g., the second direction D2). In some embodiments, a height in the third direction D3 of the second diode region 108 may be greater than a height in the third direction D3 of the first diode region 106. In some embodiments, a height in the third direction D3 of the second diode region 108 may be greater than a height in the third direction D3 of the lower source/drain region 140.

Although the second diode region 108 is shown as a continuous region in FIG. 6, the present disclosure is not limited thereto, and in some embodiments one or more sub-regions or layers may be formed which together constitute the second diode region 108. The same may be said of any of the layers or regions provided herein, unless otherwise stated.

Figure 7:
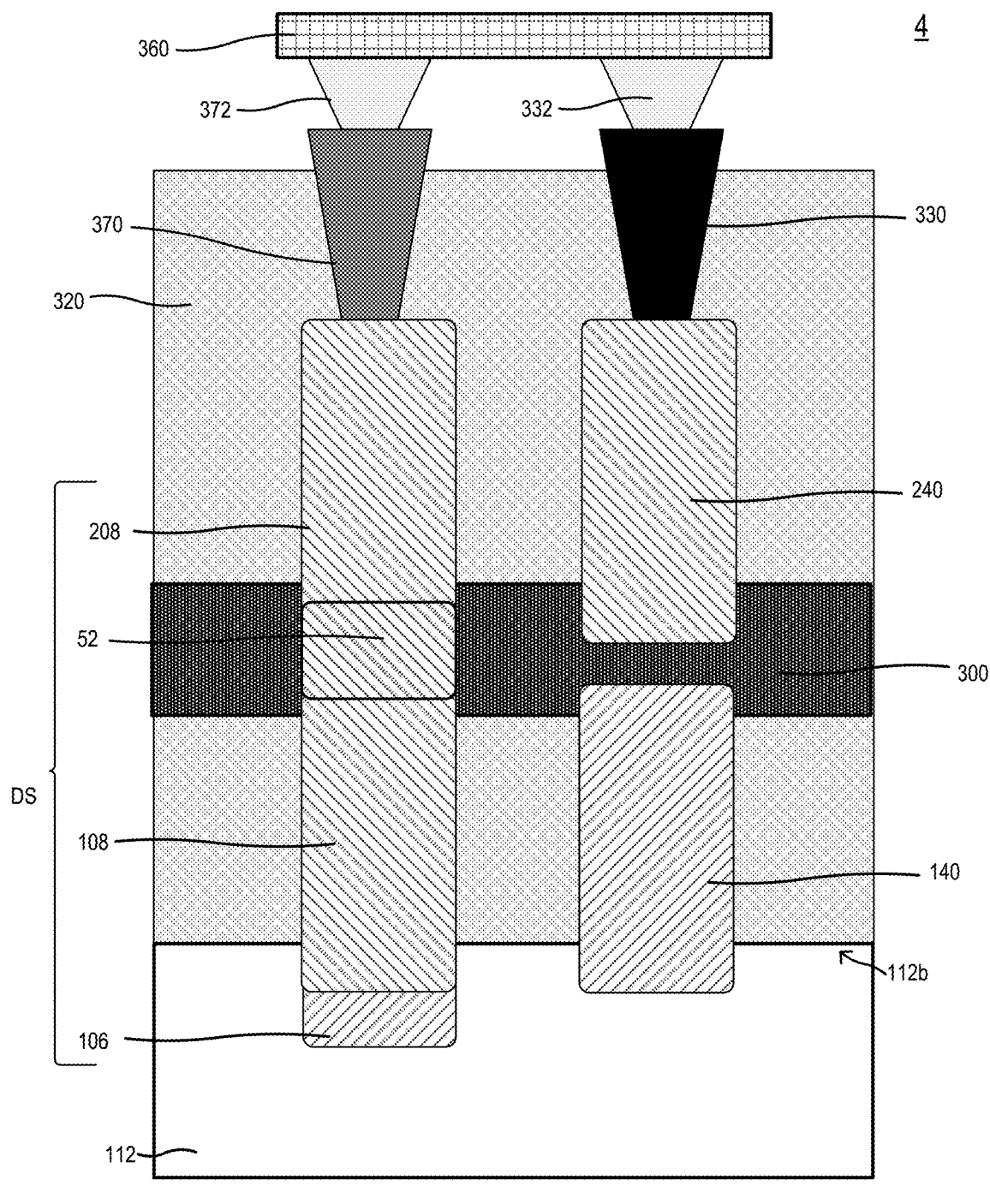
FIG. 7 is a cross-sectional view of an integrated circuit device taken along the line B-B' in FIG. 1 according to some embodiments.
Figure 7:
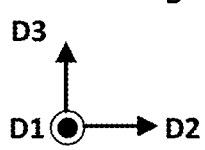

FIG. 7 is a cross-sectional view of an integrated circuit device 4 taken along the line B-B' in FIG. 1 according to some embodiments. The integrated circuit device 4 may be similar to the integrated circuit device 1 with a primary difference being that a semiconductor layer 52 is provided between the third semiconductor region 208 and the second diode region 108 and contacts both the third semiconductor region 208 and the second diode region 108. The third semiconductor region 208 may be a third diode region 208. The third semiconductor region 208, the semiconductor layer 52 and the second diode region 108 may collectively form a single diode region, and together with the first diode region 106 may collectively form a single diode. The third semiconductor region 208, the semiconductor layer 52, and the second diode region 108 may have a common conductivity type (which may be the same conductivity type as the upper source/drain regions 240 of the upper transistor structure 200).

Figure 8:
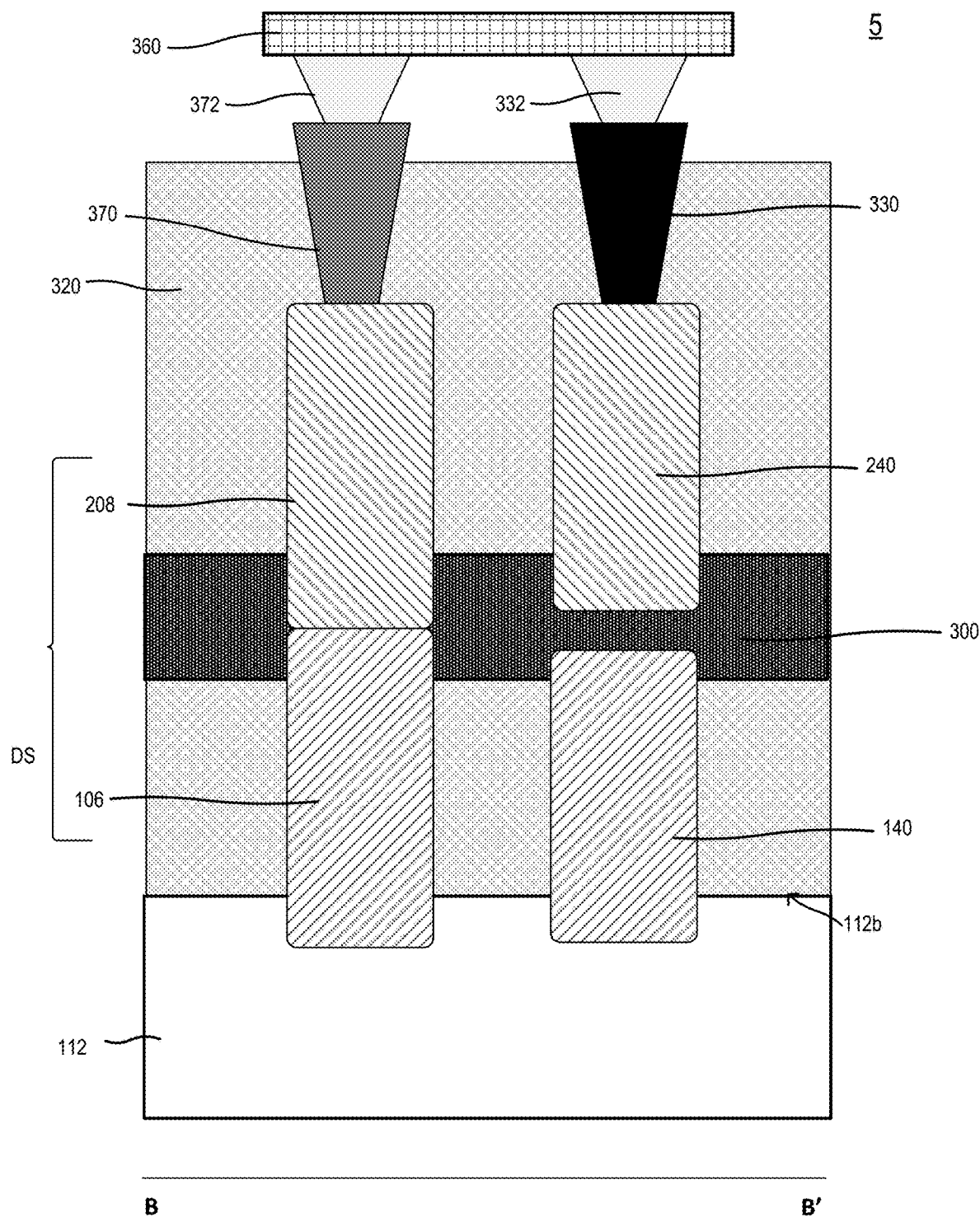
FIG. 8 is a cross-sectional view of an integrated circuit device taken along the line B-B' in FIG. 1 according to some embodiments.

FIG. 8 is a cross-sectional view of an integrated circuit device taken along the line B-B' in FIG. 1 according to some embodiments. The integrated circuit device 5 may be similar to the integrated circuit device 1 with a primary difference being that the diode structure DS may be formed from the first diode region 106 and the third semiconductor region 208, which may directly contact each other. The first diode region 106 may have the same conductivity type as the lower source/drain region 140, and the first diode region 106 and the lower source/drain region 140 may be formed at the same time and via the same process. The third semiconductor region 208 may have the same conductivity type as the upper source/drain regions 240, and the third semiconductor region 208 and the upper source/drain regions 240 may be formed at the same time and via the same process. The third semiconductor region 208 and the first diode region 106 may collectively form a single diode. The second diode region 108 may not be formed.

Figure 9:
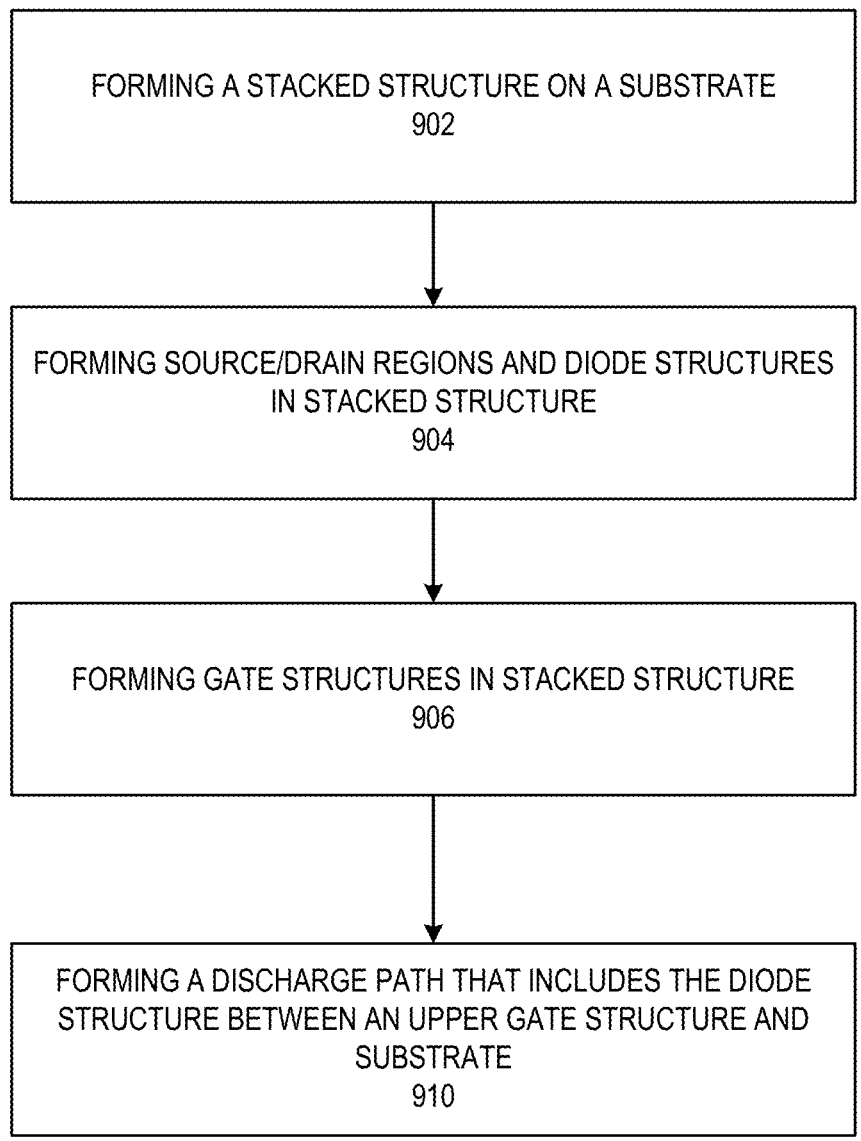
FIG. 9 is a flowchart showing operations in a method of forming an integrated circuit device according to some embodiments.

FIG. 9 is a flowchart showing operations in a method of forming an integrated circuit device according to some embodiments. FIGS. 10, 11A, 12A, and 13 are intermediate cross-sectional views taken along line A-A' of FIG. 1, and FIGS. 11B, 12B, 14, 15, and 16 are intermediate cross-sectional views taken along line B-B' of FIG. 1.

Figure 10:
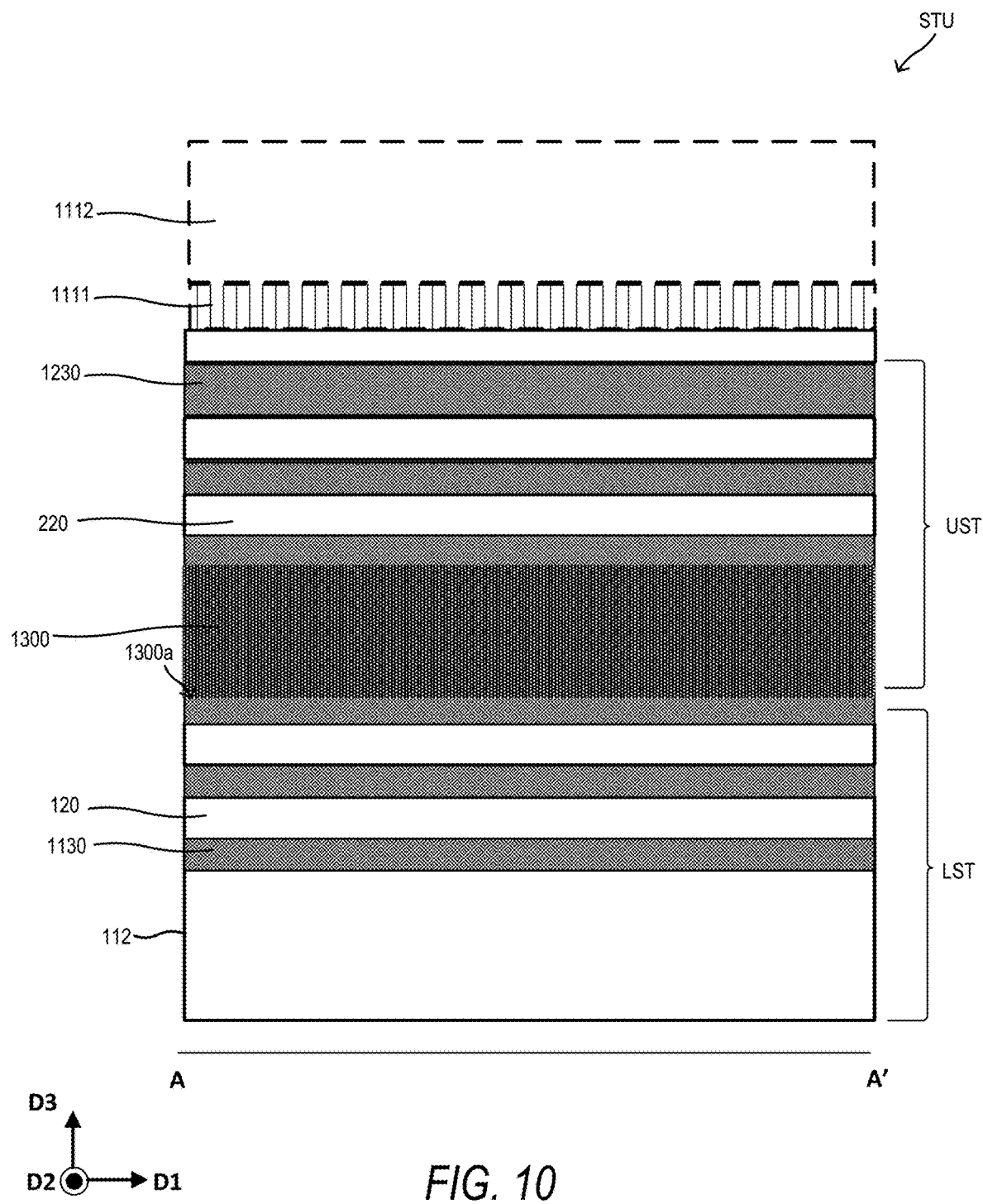
FIGS. 10, 11A, 12A, and 13 are intermediate cross-sectional views taken along line A-A' of FIG. 1, and FIGS. 11B, 12B, 14, 15, and 16 are intermediate cross-sectional views taken along line B-B' of FIG. 1.

Referring to FIG. 9 and FIG. 10, a stack structure STU may be formed by one or more of various processes (block 902 of FIG. 9). For example, an upper stack portion UST may be formed by forming upper channel layers 220, upper sacrificial layers 1230 that are alternately stacked with the upper channel layers 220 and an insulator layer 1300 on an upper substrate 1112 and then performing an ion implantation process to form a separation layer 1111. The ion implantation process may implant ions (e.g., hydrogen ions) into a portion of the upper substrate 1112, and thus the separation layer 1111 may include those implanted ions. Alternatively, the upper stack portion UST may be formed by forming the separation layer 1111 through, for example, a deposition process on the upper substrate 1112, and then the upper channel layers 220, the upper sacrificial layers 1230 and the insulator layer 1300 may be formed on the separation layer 1111. The separation layer 1111 may include, for example, SiN, SiBCN, SiOCN, SiBN, SiCN, SiO and/or SiON.

A lower stack portion LST may be formed and may include a lower substrate 112, and lower channel layers 120 and lower sacrificial layers 1130 stacked alternately with the lower channel layers 120 on the lower substrate 112.

The lower sacrificial layers 1130 and the upper sacrificial layers 1230 may include a material having an etch selectivity with respect to the lower and upper channel layers 120 and 220. The lower and upper sacrificial layers 1130 and 1230 may include, for example, semiconductor material(s) (e.g., Si, Ge, SiGe, GaP, GaAs, SiC, SiGeC and/or InP). In some embodiments, the lower and upper sacrificial layers 1130 and 1230 may include a SiGe layer.

An upper surface of the insulator layer 1300a may be stacked on the uppermost layer 120/1130 of the lower stack portion LST. The upper substrate 1112 and the separation layer 1111 may then be removed, thereby forming the stack structure STU. For example, the separation layer 1111 may be removed by performing an annealing process to split the separation layer 1111 from the upper channel layers 220. In some embodiments, a dry etching process and/or a Chemical Mechanical Polishing (CMP) process may be performed to remove the upper substrate 1112 and the separation layer 1111, and the separation layer 1111 may be used as an etch stop layer while removing the upper substrate 1112.

In some embodiments, the lower stack portion LST may also include an insulator layer similar to the insulator layer 1300 of the upper stack portion UST, and the upper stack portion UST may be stacked on the insulator layer of the lower stack portion LST. In some embodiments, the lower stack portion LST may include an insulator layer similar to the insulator layer 1300 of the upper stack portion UST, and the insulator layer 1300 of the upper stack portion UST may be omitted, and the upper stack portion UST may be stacked on the insulator layer of the lower stack portion LST.

In some embodiments, the stack structure STU may be formed by providing a lower substrate 112, and then alternately stacking the lower channel layers 120 and the lower sacrificial layers 1130 on the lower substrate 112. The insulator layer 1300 may then be formed on the stack of lower channel layers 120 and the lower sacrificial layers 1130. Upper sacrificial layers 1230 and upper channel layers 220 may be alternately stacked on the insulator layer 1300, which may become the middle isolation layer 300. Thus, in some embodiments, the upper substrate 1112 and the separation layer 1111 may not be used in the formation of the stack structure STU.

Figure 11A:
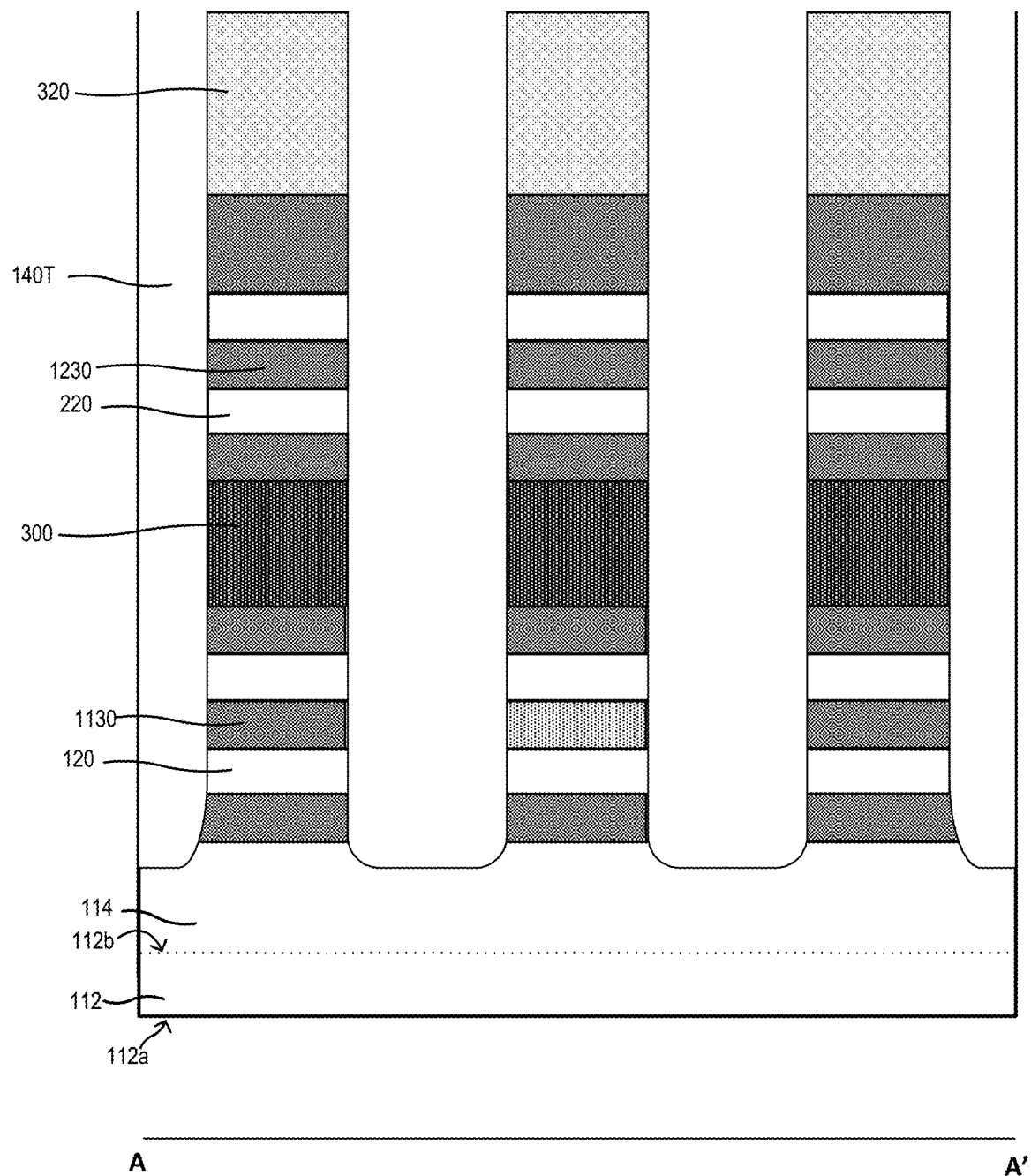
Figure 11B:
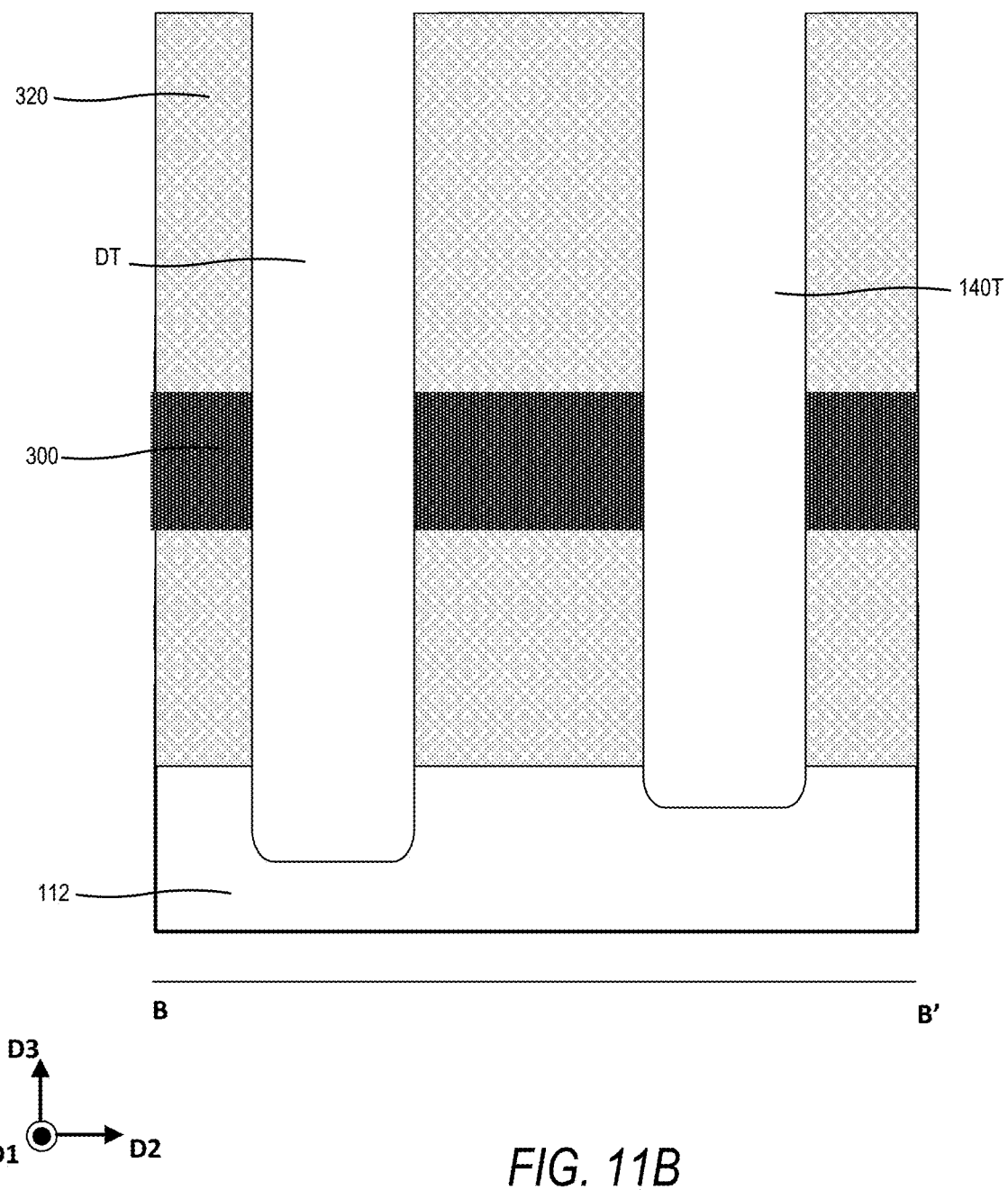

Referring to FIGS. 11A and 11B, source/drain trenches 140T and diode trenches DT may be formed in the stack structure STU. For example, a mask layer (not shown) may be formed and the stack structure STU may be etched using the mask layer as an etch mask until the substrate 112 is exposed, thereby forming semiconductor regions 114. The mask layer may then be removed, and an insulating layer 320 may be formed on remaining portions of the stack structure STU. In some embodiments, the diode trenches DT may have different dimensions than the source/drain trenches 140T. For example, the diode trenches DT may extend further into the substrate 112 from an upper surface 112b thereof than the source/drain trenches 140T.

Figure 12A:
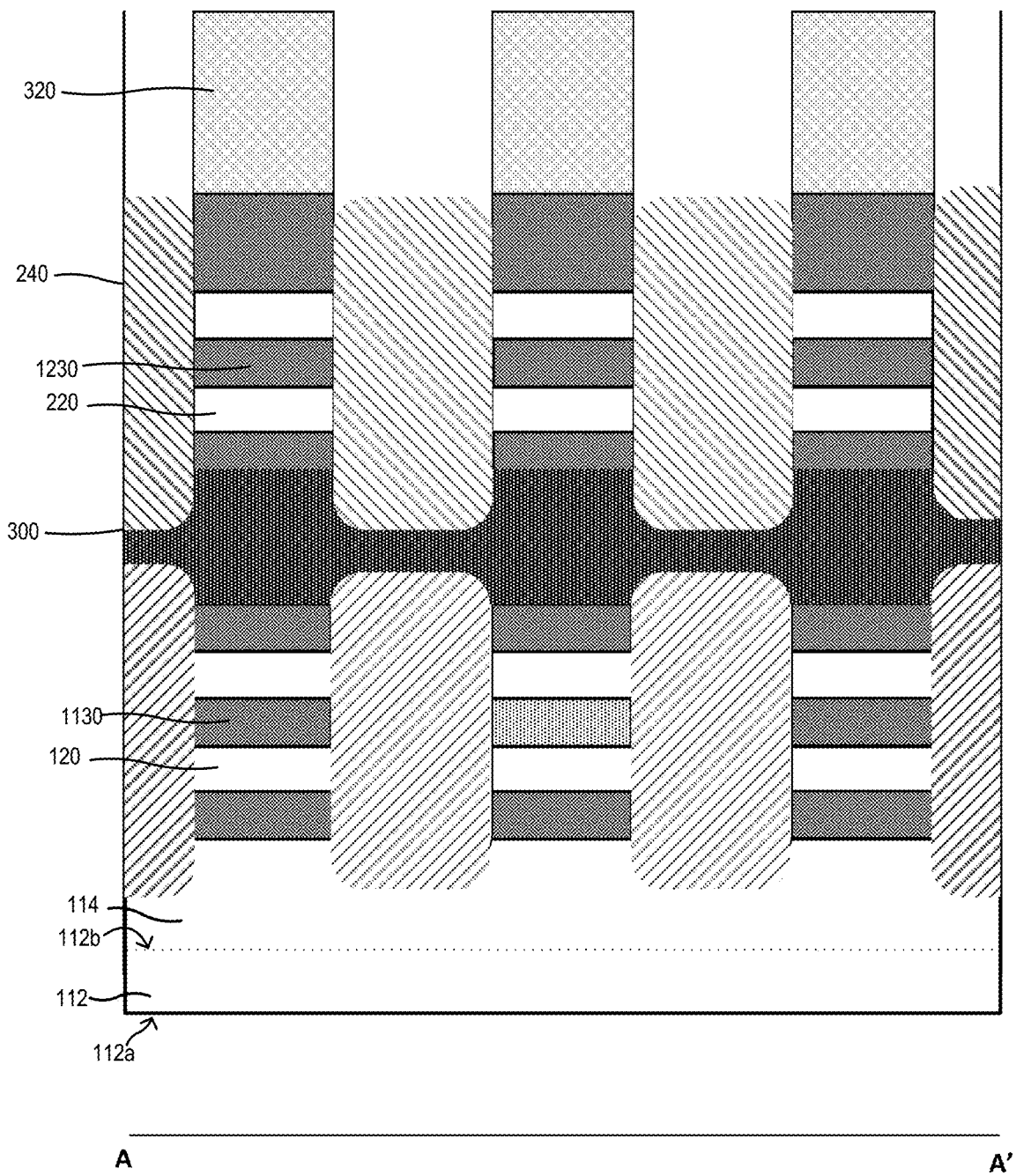
Figure 12B:
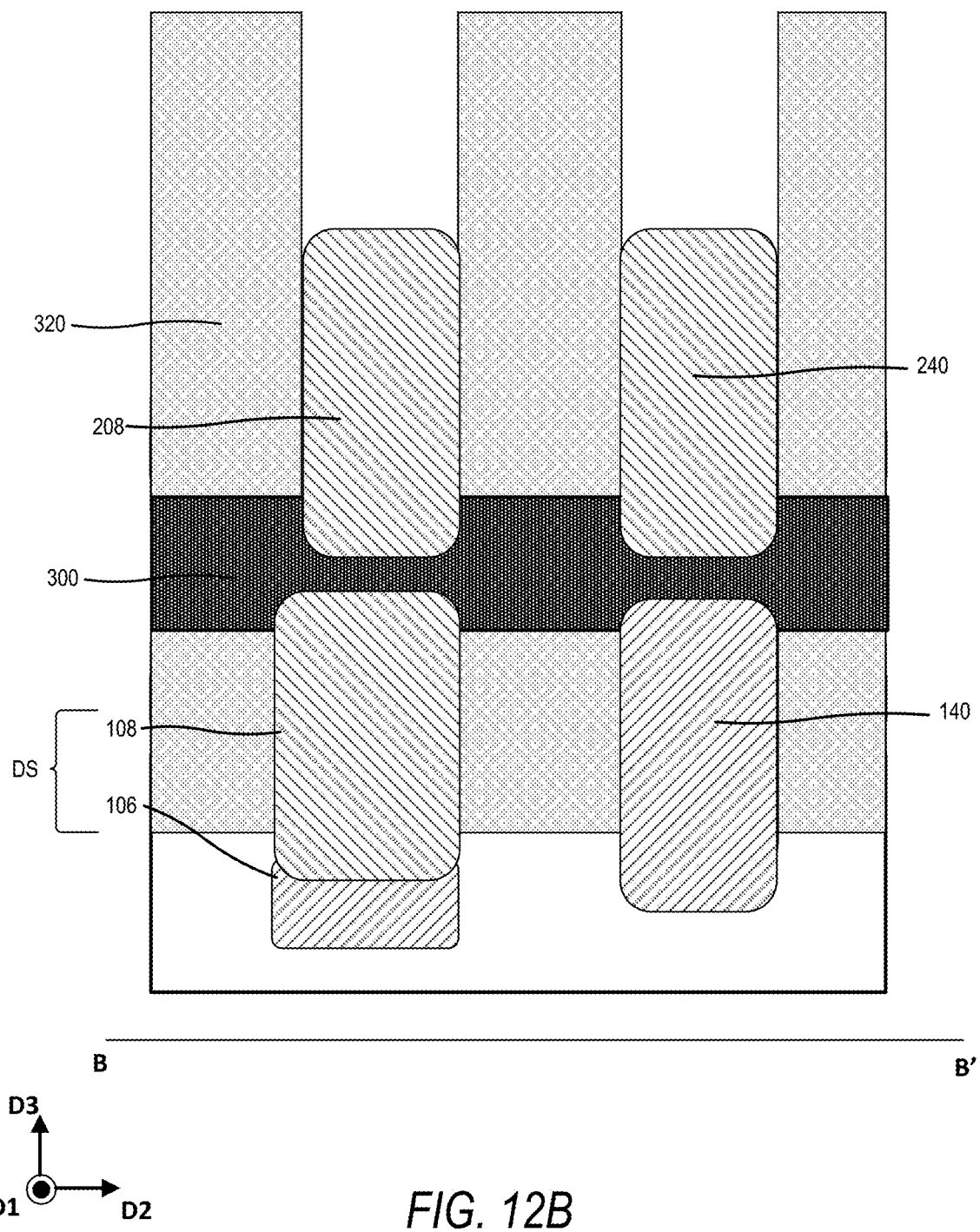

Referring to FIGS. 9, 12A, and 12B, lower source/drain regions 140 and upper source/drain regions 140 may be formed in at least some of the source/drain trenches 140T, and diode structures DS may be formed in the diode trenches DT (block 904 of FIG. 9).

For example, the lower source/drain regions 140 may be formed by an epitaxial growth process using the lower channel regions 120 as a seed layer, and the upper source/drain regions 240 may be formed by an epitaxial growth process using the upper channel regions 220 as a seed layer. In some embodiments, a source/drain insulator may be formed on the lower source/drain region 140 before forming the upper source/drain region 240.

The diode structure DS may include a first semiconductor region 106 and a second semiconductor region 108, which may be a first diode region 106 and a second diode region 108, respectively. The first diode region 106 may be a lower diode region may have a conductivity type that is the same as the conductivity type of the lower source/drain region 140 (e.g., the first conductivity type), and may be formed concurrently with the lower source/drain region 140. The second semiconductor region 108 may be an upper diode region and may have a conductivity type that is the same as the conductivity type of the upper source/drain regions 240 (e.g., the second conductivity type) and may be formed concurrently with the upper source/drain regions 240. The first diode region 106 and the second diode region 108 may directly contact one another and form a junction (e.g., a P-N junction) therebetween. In some embodiments, the first diode region 106 and the second diode region 108 may be vertically stacked, where the second diode region 108 is on the first diode region 106 in the third (vertical) direction D3.

When the lower source/drain regions 140 and the first diode region 106 are formed as p-type regions, a p-type impurity source gas, such as diborane ($B_2H_6$) gas, may be introduced during the epitaxial growth process thereof (e.g., during a selective epitaxial growth process (SEG)) to form the lower source/drain regions 140 and the first diode region 106 as doped with p-type impurities. When the upper source/drain regions 240 and the second diode region 108 are formed as n-type regions, a n-type impurity source gas such as $POCl_3$, $P_2O_5$, or the like, may be introduced during the epitaxial growth process thereof to form the upper source/drain regions 240 and the second diode region 108 as doped with n-type impurities. The present disclosure is not limited to forming the lower and upper source/drain regions 140, 240 and first and second diode regions 106, 108 using impurity source gases during epitaxial growth processes. In some embodiments, the lower source/drain regions 140 and the first diode region 106 may be formed as n-type regions (e.g., using an n-type impurity source gas), and the upper source/drain regions 240 and the second diode region 108 may be formed as p-type regions (e.g., using a p-type impurity source gas). In FIG. 12B, the first diode region 106 and the second diode region 108 are shown to be wider in the second direction D2 than the lower source/drain region 140, but this is merely one example and the present disclosure is not limited thereto.

In some embodiments, the third semiconductor region 208 and the upper source/drain regions 240 may be formed at the same time and via the same process. In some embodiments, the third semiconductor region 208 and the first diode region 106 may collectively form a single diode. In some embodiments, the second diode region 108 may not be formed. In some embodiments, the middle isolation layer 300 may be formed (or reformed) between the lower source/drain region 140 and the upper source/drain region 240, and the middle isolation layer 300 may be formed (or reformed) on the second diode region 108.

Source/drain contacts (not shown) may be formed in the source/drain trenches 140T. In some embodiments, an additional insulating layers 320 may be formed to fill remaining portions of the source/drain trenches 140T and diode trenches DT.

Figure 13:
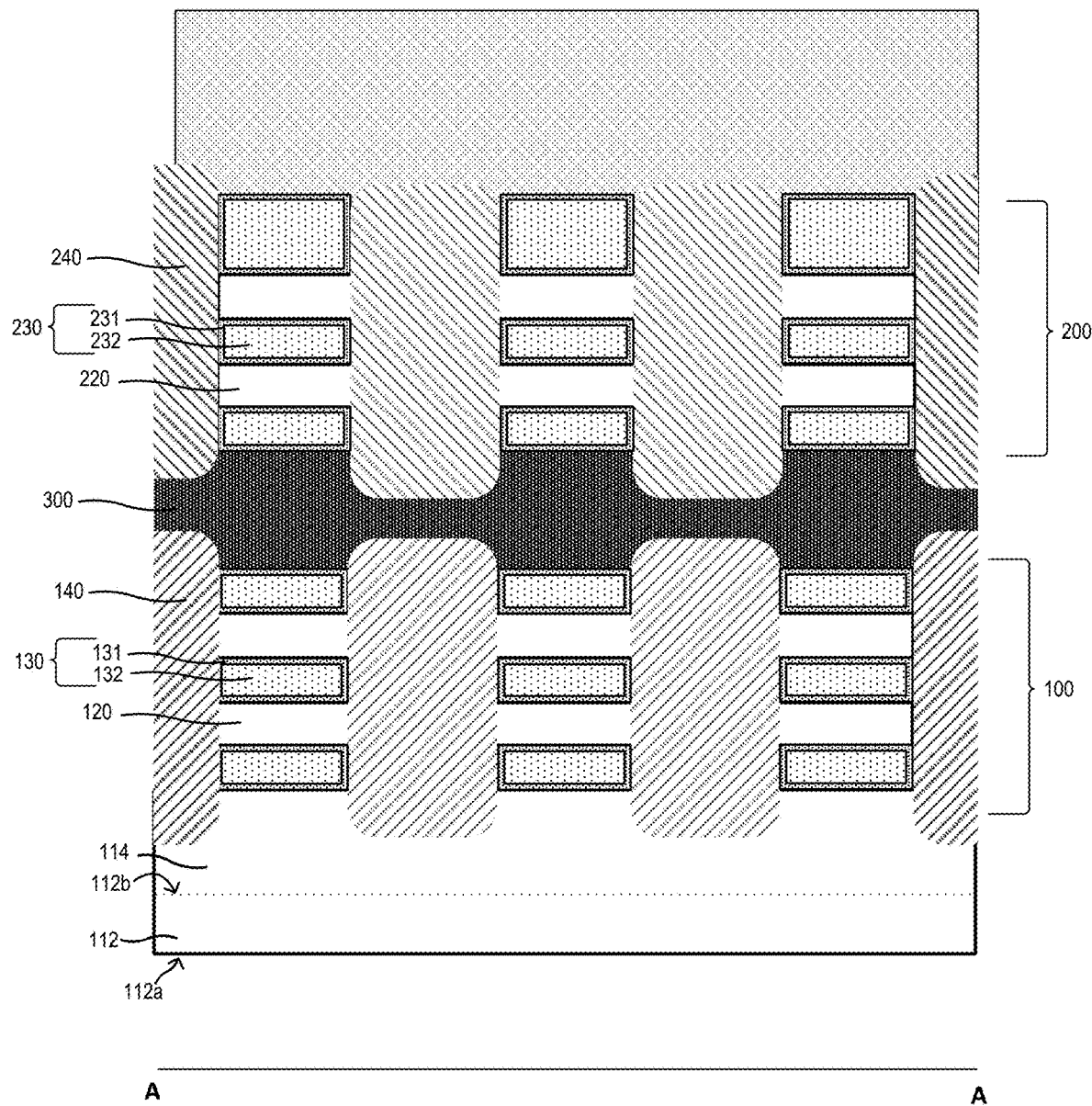

Referring to FIGS. 9 and 13, lower and upper gate structures 130 and 230 may be formed (block 906 of FIG. 9). Referring to FIG. 13, the upper sacrificial pattern 1230 and the lower sacrificial pattern 1130 may be removed to expose the lower and upper channel regions 120 and 220, and then lower and upper gate insulators 131 and 231 may be formed on the lower and upper channel regions 120 and 220, respectively. The lower gate insulator 131 may define a first opening and the upper gate insulator 231 may define a second opening. A lower gate electrode 132 may be formed in the first opening, and an upper gate electrode 232 may be formed in the second opening.

The lower gate structure 130, lower channel regions 120, and lower source/drain regions 140 may form a lower transistor structure 100. The upper gate structure 230, upper channel regions 220, and upper source/drain regions 240 may form an upper transistor structure 200.

Figure 14:
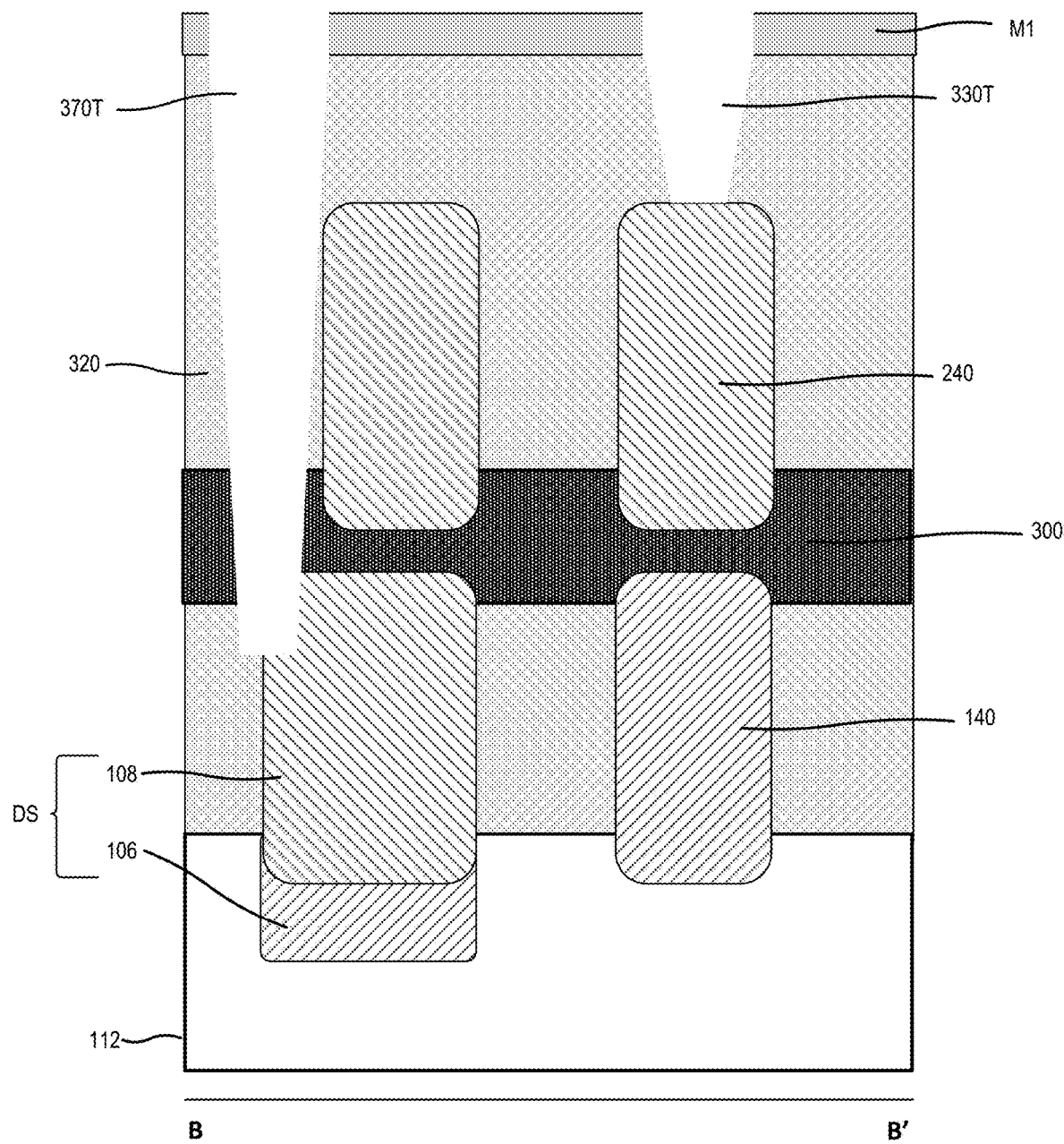
Figure 14:
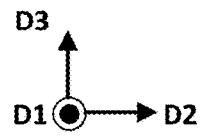
Figure 15:
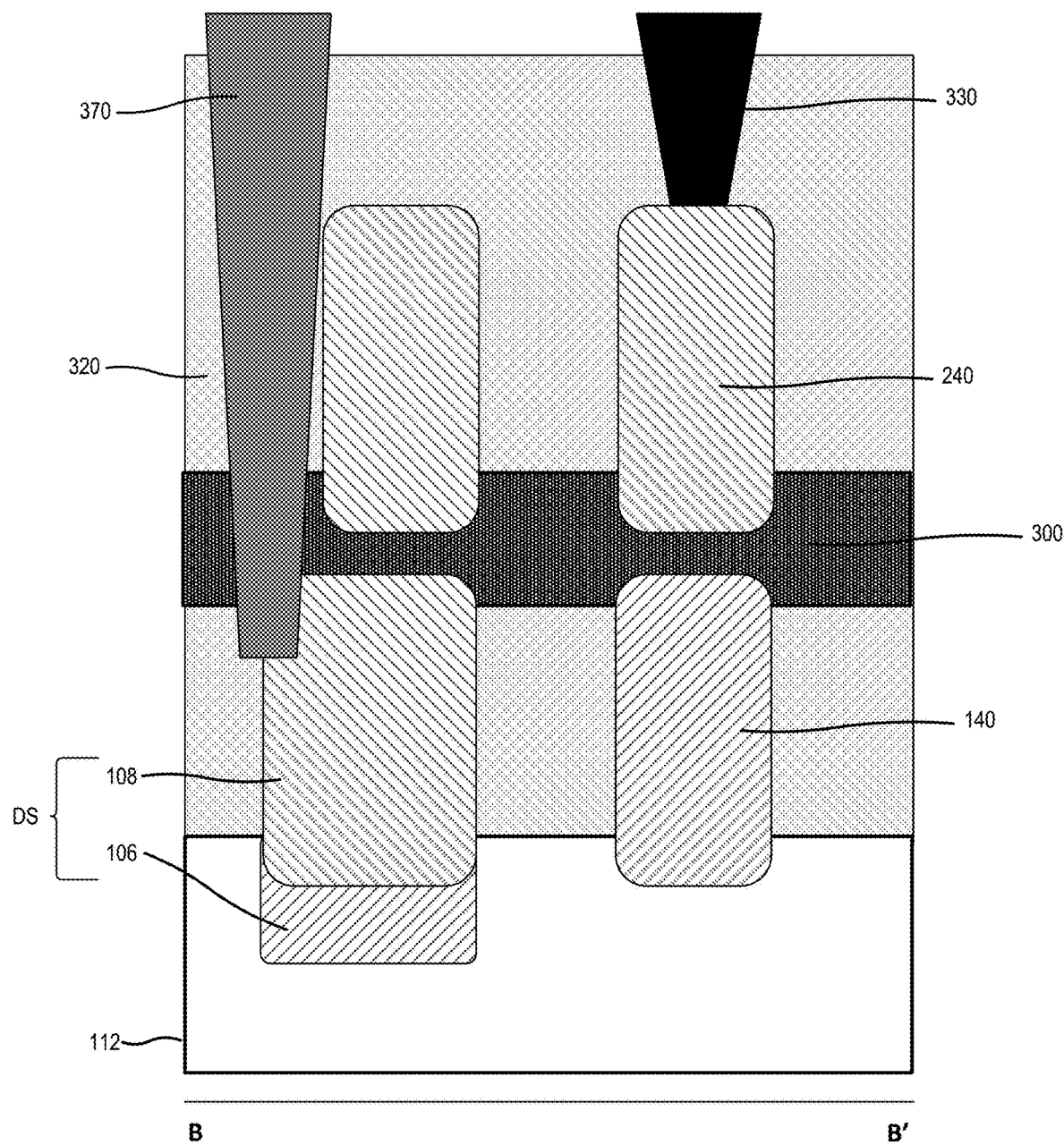
Figure 16:
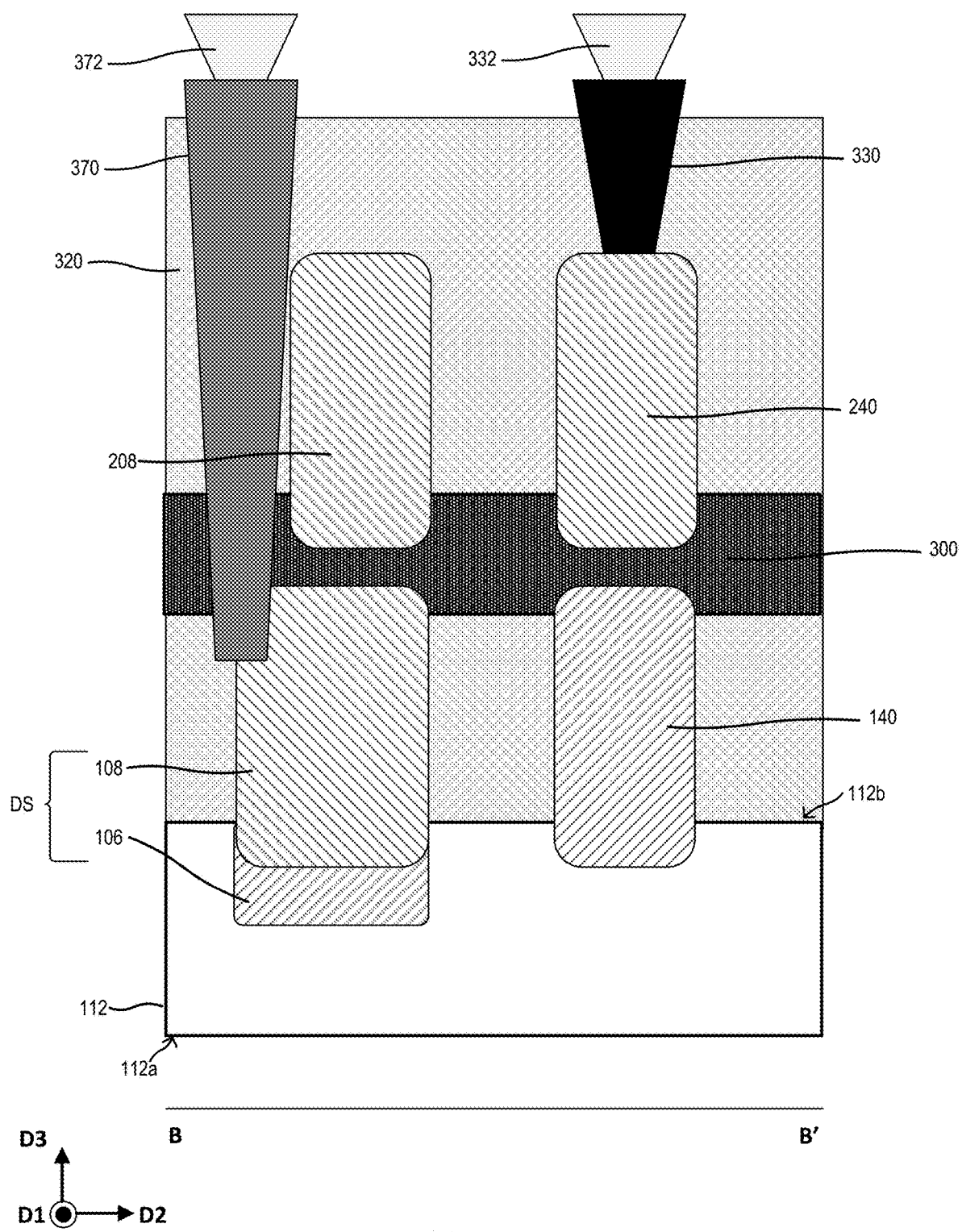

Referring to FIGS. 9, 14, 15, 16, 2A, 2B, and 3, a discharging path DP may be formed between the upper transistor structure 200 and the substrate 112 (block 910 of FIG. 9). The discharging path DP may include the diode structure DS. The discharging path DP may extend through the middle isolation layer 300. Referring to FIG. 14, a mask layer M1 may be formed on an upper surface of the insulating layer 320. Gate contact trenches 330T and discharge contact trenches 370T may be formed in the insulating layer 320 to expose portions of the upper gate structure 230 and diode structure DS, respectively. Referring to FIG. 15, gate contacts 330 may be formed in the gate contact trenches 330T, and discharge contacts 370 may be formed in the discharge contact trenches 370T. The mask layer M1 may be removed. Referring to FIG. 16, gate vias 322 may be formed on the gate contacts 330, and discharge vias 372 may be formed on the discharge contacts 370. Referring to FIGS. 2A and 2B, one or more metal layers, including a first metal layer 360, may be formed on the gate vias 322 and discharge vias 372.

Referring back to FIG. 3, the discharging path DP that may be formed may extend from a gate contact 330, which may be formed to electrically contact with the upper gate electrode 232 of the upper transistor structure 200. The discharging path DP may include one or more metal layers, including a first metal layer 360, that may be formed above the gate contact 330. The one or more metal layers may be back end of line (BEOL) metal layers. The discharging path DP may include a discharge contact 370, which may be formed and which in some embodiments may penetrate or extend through the middle isolation layer 300. The discharge contact 370 may be in electrical contact with the first metal layer 360 through a discharge via 372, which may be formed. The gate contact 330 may be in electrical contact with the first metal layer 360 via a gate via 322, which may be formed.

Some examples of embodiments are described herein with reference to the accompanying drawings. Many different forms and embodiments are possible without deviating from the scope of the present invention. Accordingly, the present invention should not be construed as limited to the example embodiments set forth herein. Rather, these example embodiments are provided so that this disclosure will be thorough and complete and will convey the scope of the present invention to those skilled in the art. In the drawings, the sizes and relative sizes of layers and regions may be exaggerated for clarity. Like reference numbers refer to like elements throughout.

Example embodiments of the present invention are described herein with reference to cross-sectional views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present invention should not be construed as limited to the particular shapes illustrated herein but include deviations in shapes that result, for example, from manufacturing, unless the context clearly indicates otherwise.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the scope of the present invention.

The above-disclosed subject matter is to be considered illustrative, and not restrictive, and the appended claims are intended to cover all such modifications, enhancements, and other embodiments, which fall within the scope of the invention. Thus, to the maximum extent allowed by law, the scope is to be determined by the broadest permissible interpretation of the following claims and their equivalents and shall not be restricted or limited by the foregoing detailed description.

What is claimed is:

1. An integrated circuit device comprising:
a substrate;
a first transistor structure on the substrate;
a second transistor structure stacked in a vertical direction on the first transistor structure;
an isolation layer between the first transistor structure and the second transistor structure in the vertical direction; and
a diode structure on the substrate and adjacent to the first transistor structure horizontally,
wherein the diode structure is part of a discharging path between a gate electrode of the second transistor structure and the substrate, and wherein the discharging path extends through the isolation layer.

2. The integrated circuit device of claim 1, further comprising a back-end-of-line (BEOL) metal layer, wherein the discharging path comprises the BEOL metal layer.

3. The integrated circuit device of claim 1, wherein the first transistor structure comprises a first source/drain region having a first conductivity type, and wherein the second transistor structure comprises a second source/drain region having a second conductivity type that is opposite from the first conductivity type.

4. The integrated circuit device of claim 3, wherein the diode structure comprises a first diode region having the first conductivity type and a second diode region that has the second conductivity type and that comprises a first portion that horizontally overlaps the first source/drain region.

5. The integrated circuit device of claim 4, wherein the first diode region is in the substrate.

6. The integrated circuit device of claim 4, wherein the second diode region is stacked on the first diode region in the vertical direction.

7. The integrated circuit device of claim 4, wherein the first diode region and a second portion of the second diode region and are adjacent to each other in a horizontal direction.

8. The integrated circuit device of claim 4, wherein the diode structure comprises a third diode region having the second conductivity type.

9. The integrated circuit device of claim 1, further comprising a discharge contact that directly contacts the diode structure, wherein the discharging path comprises the discharge contact.

10. The integrated circuit device of claim 9, wherein the discharge contact extends through the isolation layer.

11. An integrated circuit device comprising:
a substrate;
a stacked structure comprising:
a first transistor structure on the substrate and comprising a first source/drain region having a first conductivity type; and
a second transistor structure stacked in a vertical direction on the first transistor structure, the second transistor structure comprising a second source/drain region having a second conductivity type that is opposite from the first conductivity type;
an isolation layer between the first transistor structure and the second transistor structure in the vertical direction; and
a discharging path between a gate electrode of the second transistor structure and the substrate, and wherein the discharging path extends through the isolation layer and comprises a diode structure,
wherein at least a portion of the diode structure is below an upper surface of the substrate.

12. The integrated circuit device of claim 11, wherein the discharging path comprises a back-end-of-line (BEOL) metal layer.

13. The integrated circuit device of claim 11, wherein the diode structure comprises a first diode region having the first conductivity type and a second diode region that has the second conductivity type and that comprises a first portion that horizontally overlaps the first source/drain region.

14. The integrated circuit device of claim 13, wherein an upper surface of the first diode region is below the upper surface of the substrate.

15. The integrated circuit device of claim 13, wherein the second diode region is stacked on the first diode region in the vertical direction.

16. The integrated circuit device of claim 13, wherein the first diode region and a second portion of the first diode region are adjacent to each other in a horizontal direction.

* * * * *